(12) United States Patent
Xu et al.

(10) Patent No.: US 12,356,826 B2
(45) Date of Patent: Jul. 8, 2025

(54) DISPLAY PANEL, MANUFACTURING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Peng Xu, Beijing (CN); Wenhui Gao, Beijing (CN); Tiaomei Zhang, Beijing (CN); Shilong Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/777,054

(22) PCT Filed: Jun. 2, 2021

(86) PCT No.: PCT/CN2021/097959
§ 371 (c)(1),
(2) Date: May 16, 2022

(87) PCT Pub. No.: WO2022/252155
PCT Pub. Date: Dec. 8, 2022

(65) Prior Publication Data
US 2024/0164173 A1      May 16, 2024

(51) Int. Cl.
*H10K 59/40*      (2023.01)
*H10K 59/12*      (2023.01)
(Continued)

(52) U.S. Cl.
CPC ......... *H10K 59/40* (2023.02); *H10K 59/1201* (2023.02); *H10K 59/131* (2023.02); *H10K 71/70* (2023.02)

(58) Field of Classification Search
CPC .. H10K 59/40; H10K 59/1201; H10K 59/131; H10K 71/70; H10K 50/00–88;
(Continued)

(56) References Cited

U.S. PATENT DOCUMENTS

| 2007/0238223 A1 | 10/2007 | Lee et al. |
| 2016/0274387 A1 | 9/2016 | Zheng et al. |

(Continued)

FOREIGN PATENT DOCUMENTS

| CN | 104656292 A | 5/2015 |
| CN | 104914606 A | 9/2015 |

(Continued)

*Primary Examiner* — Cuong B Nguyen
(74) *Attorney, Agent, or Firm* — Ling Wu; Stephen Yang; Ling and Yang Intellectual Property

(57) ABSTRACT

A display panel, a manufacturing method thereof, and a display device are provided. The display panel comprises a base substrate, an effective region provided on the base substrate and a bonding region located on one side of the effective region; the bonding region comprises a bonding pin region including a bonding pin, a virtual pin and test signal lines; an orthographic projection of at least one of the test signal lines on the base substrate is within a range of an orthographic projection of the virtual pin on the base substrate, and the orthographic projection of the virtual pin on the base substrate does not overlap with an orthographic projection of the bonding pin on the base substrate.

19 Claims, 10 Drawing Sheets

(51) Int. Cl.
*H10K 59/131* (2023.01)
*H10K 71/70* (2023.01)

(58) Field of Classification Search
CPC .......... H10K 50/805–828; H10K 2102/10–20;
G09G 3/00
See application file for complete search history.

(56) References Cited

U.S. PATENT DOCUMENTS

| | | |
|---|---|---|
| 2017/0139534 A1 | 5/2017 | Hao |
| 2017/0196080 A1 | 7/2017 | Meng et al. |
| 2020/0210041 A1 | 7/2020 | Liu |
| 2020/0251392 A1 | 8/2020 | Wang et al. |
| 2022/0066609 A1 | 3/2022 | Han et al. |
| 2022/0254285 A1 | 8/2022 | Wang et al. |

FOREIGN PATENT DOCUMENTS

| | | |
|---|---|---|
| CN | 105632382 A | 6/2016 |
| CN | 109144320 A | 1/2019 |
| CN | 109445649 A | 3/2019 |
| CN | 109841535 A | 6/2019 |
| CN | 109979366 A | 7/2019 |
| CN | 110867139 A | 3/2020 |
| CN | 111509026 A | 8/2020 |
| CN | 111951669 A | 11/2020 |
| CN | 112035013 A | 12/2020 |
| CN | 112860122 A | 5/2021 |
| JP | 2005-12209 A | 1/2005 |
| KR | 10-2016-0082555 A | 7/2016 |
| KR | 10-2018-0013531 A | 2/2018 |

DISPLAY PANEL, MANUFACTURING METHOD THEREOF, AND DISPLAY DEVICE

CROSS-REFERENCE TO RELATED APPLICATION

The present disclosure is a U.S. National Phase Entry of International Application PCT/CN2021/097959 having an international filing date of Jun. 2, 2021, and the contents disclosed in the above-mentioned application are hereby incorporated as a part of this application.

TECHNICAL FIELD

Embodiments of the present disclosure relate to, but are not limited to, the field of display technology, in particular to a display panel and a method for manufacturing the display panel, and a display device.

BACKGROUND

As an active light-emitting display device, an Organic light-emitting Diode (OLED) has advantages of autoluminescence, wide viewing angle, high contrast ratio, low power consumption, extremely quick response, etc. With constant development of display technologies, a flexible display using an OLED as a light-emitting device and performing signal control by use of a Thin Film Transistor (TFT for short) has become a mainstream product in the field of display at present. According to product requirements for flexible folding, narrow bezel, etc., an existing OLED-based touch structure uses a structural form of a flexible-covering-surface type with a flexible touch substrate provided on an encapsulation layer of an OLED back-plane, has advantages of lightweight, lightness, thickness, foldability, etc., and may meet the product requirements for flexible folding, narrow bezel, etc.

SUMMARY

The following is a summary of subject matters described herein in detail. The summary is not intended to limit the protection scope of claims.

An embodiment of the present disclosure provides a display panel, including a base substrate, an effective region provided on the base substrate and a bonding region located on a side of the effective region, wherein the bonding region includes a bonding pin region including bonding pins, virtual pins and test signal lines, an orthographic projection of at least one of the test signal lines on the base substrate is within a range of an orthographic projection of the virtual pins on the base substrate, and the orthographic projection of the virtual pins on the base substrate does not overlap with an orthographic projection of the bonding pins on the base substrate.

In an exemplary embodiment, the effective region includes the base substrate and a display unit and a touch unit which are stacked on the base substrate, the display unit includes multiple data lines and multiple gate lines, the multiple data lines and the multiple gate lines intersect with each other to define multiple sub-pixels, and the touch unit includes multiple touch electrodes and touch leads connected to the touch electrodes; the display panel further includes an array test region located on a side of the bonding region away from the effective region, the array test region includes test pins, and the test signal lines are connected to the test pins and are configured to test one or more of the display unit and the touch unit.

In an exemplary embodiment, the virtual pins include a first virtual pin and a second virtual pin, an orthographic projection of the first virtual pin on the base substrate does not overlap with an orthographic projection of the second virtual pin on the base substrate, an orthographic projection of at least one of the test signal lines on the base substrate is within a range of the orthographic projection of the first virtual pin on the base substrate, and the orthographic projection of the test signal line on the base substrate does not overlap with the orthographic projection of the second virtual pin on the base substrate.

In an exemplary embodiment, in a plane perpendicular to the display panel, the display panel includes a first conductive layer provided on the base substrate, a second conductive layer provided on the first conductive layer, a third conductive layer provided on the second conductive layer, and a fourth conductive layer provided on the third conductive layer; the test signal lines are provided in a same layer as at least one of the first conductive layer and the second conductive layer; the first virtual pin is provided in a same layer as the fourth conductive layer; and the bonding pins and the second virtual pin are provided in same layers as the third conductive layer and the fourth conductive layer respectively.

In an exemplary embodiment, in a plane perpendicular to the display panel, the display panel includes: a driving circuit layer, a light-emitting structure layer, an encapsulation layer and a touch electrode layer which are sequentially stacked on the base substrate; the driving circuit layer includes a first insulating layer, an active layer, a second insulating layer, a first gate metal layer, a third insulating layer, a second gate metal layer, a fourth insulating layer and a first source-drain metal layer which are stacked on the base substrate, and the touch electrode layer includes a touch insulating layer, a touch electrode layer and a touch protective layer which are stacked on the encapsulation layer; the first conductive layer is provided in a same layer as the first gate metal layer, the second conductive layer is provided in a same layer as the second gate metal layer, the third conductive layer is provided in a same layer as the first source-drain metal layer, and the fourth conductive layer is provided in a same layer as the touch electrode layer.

In an exemplary embodiment, a width of the orthographic projection of the first virtual pin on the base substrate in a first direction is equal to a width of an orthographic projection of M test signal lines on the base substrate in the first direction, a distance between two adjacent pins is greater than a width of N test signal lines in the first direction, M is a natural number greater than or equal to 1, and N is a natural number greater than or equal to 1.

In an exemplary embodiment, M is 3, and N is 1.

In an exemplary embodiment, x first virtual pins are provided between two second virtual pins, and x is a natural number between 1 and 3.

In an exemplary embodiment, a height of the second virtual pin at a side away from the base substrate with respect to the base substrate is greater than a height of the first virtual pin at a side away from the base substrate with respect to the base substrate.

In an exemplary embodiment, the test signal lines include first test signal lines located on the first conductive layer and second test signal lines located on the second conductive layer; an orthographic projection of the first test signal lines on the base substrate does not overlap with an orthographic projection of the second test signal lines on the base substrate, the first test signal lines and the second test signal lines extend in a second direction, and the first test signal lines and the second test signal lines are alternately provided in a first direction, wherein the first direction intersects with the second direction.

In an exemplary embodiment, a width of a first test signal line in the first direction is equal to a width of a second test signal line in the first direction, and a distance between adjacent first test signal lines is equal to a distance between adjacent second test signal lines.

In an exemplary embodiment, the width of the first test signal line in the first direction is between 7 microns and 17 microns, and the distance between adjacent first and second test signal lines is between 8 microns and 18 microns.

In an exemplary embodiment, a width of a bonding pin in the first direction is equal to a width of a virtual pin in the first direction, and a distance between two adjacent pins is equal.

In an exemplary embodiment, the width of the bonding pin in the first direction is between 45 microns and 75 microns, and the distance between two adjacent pins is between 25 microns and 55 microns.

In an exemplary embodiment, a length of the bonding pin in the second direction is equal to a length of the virtual pin in the second direction, and the length of the bonding pin in the second direction is between 900 microns and 1000 microns.

In an exemplary embodiment, the display panel also includes a first power supply line and a second power supply line, 2n test signal lines are included, the bonding pins include multiple first bonding pins and multiple second bonding pins, the multiple first bonding pins are connected to the first power supply line, the multiple second bonding pins are connected to the second power supply line, the 2n test signal lines are provided between the multiple second bonding pins, the multiple second bonding pins are provided between the multiple first bonding pins, the 2n test signal lines are symmetrically provided along a center line of the bonding region, the multiple first bonding pins are symmetrically provided along the center line of the bonding region, and the multiple second bonding pins are symmetrically provided along the center line of the bonding region.

In an exemplary embodiment, n test signal lines are divided into at least two test signal line groups on a side of the center line of the bonding region, and at least one of the virtual pins is provided between two adjacent test signal line groups.

In an exemplary embodiment, an orthographic projection of a test signal line group on the base substrate has a width in the first direction between 150 microns and 300 microns.

An embodiment of the present disclosure further provides a display device, including any of the abovementioned display panels.

An exemplary embodiment of the present disclosure further provides a method for manufacturing a display panel, wherein the display panel includes a base substrate, an effective region provided on the base substrate and a bonding region located on one side of the effective region, the bonding region includes a bonding pin region, and the manufacturing method includes:

forming test signal lines, a bonding pin and a virtual pin in the bonding pin region, wherein an orthographic projection of at least one of the test signal lines on the base substrate is within a range of an orthographic projection of the virtual pin on the base substrate, and the orthographic projection of the virtual pin on the base substrate does not overlap with an orthographic projection of the bonding pin on the base substrate.

Other aspects may be comprehended upon reading and understanding the drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

DETAILED DESCRIPTION

Figure 1:
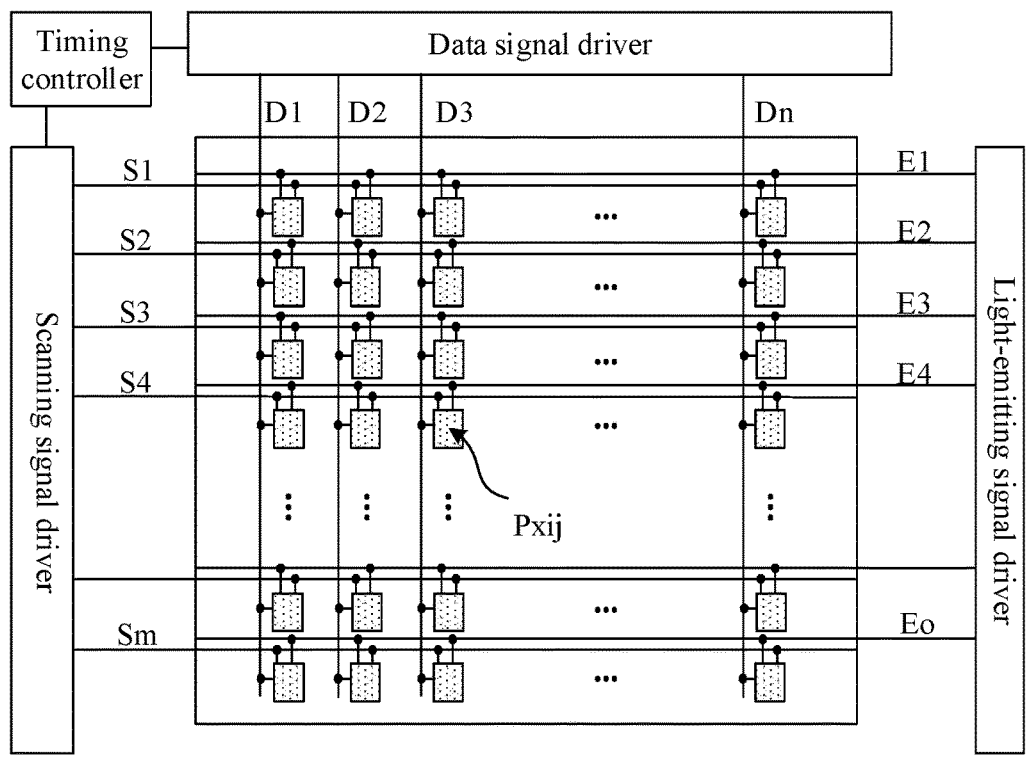
FIG. 1 is a schematic structural diagram of an OLED display panel.

The embodiments of the present disclosure will be described in detail below with reference to the drawings. It is to be noted that implementation modes may be implemented in multiple different forms. Those of ordinary skills in the art may easily understand such a fact that embodiments and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

In the drawings, a size of each constituent element, and a thickness of a layer or a region are exaggerated sometimes for clarity. Therefore, one embodiment of the present disclosure is not necessarily limited to the size, and shapes and sizes of various components in the drawings do not reflect actual scales. In addition, the drawings schematically illustrate ideal examples, and one embodiment of the present disclosure is not limited to the shapes, numerical values, or the like shown in the drawings.

Ordinal numerals such as "first", "second", "third", 1st, 2nd, and 3rd in the specification are not set to form limits in number but only to avoid confusion between constituent elements.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

Structures of capacitive On Cell type touch panels are mainly divided into a mutual capacitance structure and a self-capacitance structure. The mutual capacitance structure refers to forming mutual capacitance by overlapping a driving electrode and a sensing electrode and performing position detection based on a change of the mutual capacitance. The self-capacitance structure refers to forming self-capacitance by a touch electrode and a human body and performing position detection based on a change of the self-capacitance. A self-capacitance touch panel has a single-layer structure, and has characteristics of low power consumption, and simple structure, etc. A mutual capacitance touch panel is has a multi-layer structure, and has characteristics of multi-point touch, etc.

A display device of an exemplary embodiment of the present disclosure may include a display unit provided on a base substrate and a touch unit provided on the display unit. The display unit may be a Liquid Crystal Display (LCD) substrate, or an Organic light-emitting Diode (OLED) display substrate, or a Plasma Display Panel (PDP) display substrate, or an Electrophoretic Display (EPD) substrate. In an exemplary embodiment, the display unit is an OLED display substrate. The OLED display substrate may include a base substrate, a driving circuit layer provided on the base substrate, a light-emitting structure layer provided on the driving structure layer, and an encapsulation layer provided on the light-emitting structure layer. The touch unit is provided on the encapsulation layer of the display unit, so as to form a Touch on Thin Film Encapsulation (Touch on TFE for short) structure. Integrating a display structure and a touch structure together may achieve advantages of lightness, thinness, and foldability, etc., and meet product requirements for flexible folding, and narrow bezel, etc.

At present, Touch on TFE structures mainly includes a Flexible Multi Layer On Cell (FMLOC for short) structure and a Flexible Single Layer On Cell (FSLOC for short) structure. The FMLOC structure is based on a working principle of mutual capacitance detection, wherein a driving (Tx) electrode and a sensing (Rx) electrode are generally formed by using two layers of metal, and an Integrated Circuit (IC) achieves a touch action by detecting mutual capacitance between the driving electrode and the sensing electrode. The FSLOC structure is based on a working principle of self-capacitance (or voltage) detection, wherein a touch electrode is generally formed by using a single layer of metal, and an integrated circuit achieves a touch action by detecting self-capacitance (or voltage) of the touch electrode.

FIG. 1 is a schematic structural diagram of an OLED display panel. As shown in FIG. 1, the OLED display panel may include a timing controller, a data signal driver, a scanning signal driver, a light-emitting signal driver, and a pixel array, wherein the pixel array may include multiple scanning signal lines (S1 to Sm), multiple data signal lines (D1 to Dn), multiple light-emitting signal lines (E1 to Eo), and multiple sub-pixels Pxij. In an exemplary embodiment, the timing controller may provide a gray-scale value and a control signal which are suitable for a specification of the data signal driver to the data signal driver, provide a clock signal, a scan starting signal, etc., which are suitable for a specification of the scanning signal driver to the scanning signal driver, and provide a clock signal, a light-emitting stopping signal, etc., which are suitable for a specification of the light-emitting signal driver to the light-emitting signal driver. The data signal driver may generate a data voltage to be provided to the data signal lines D1, D2, D3, . . . , and Dn using the gray-scale value and the control signal that are received from the timing controller. For example, the data signal driver may sample the gray-scale value using the clock signal and apply a data voltage corresponding to the gray-scale value to the data signal lines D1 to Dn by taking a pixel row as a unit, wherein n may be a natural number. The scanning signal driver may receive the clock signal, the scan starting signal, etc., from the timing controller to generate a scanning signal to be provided to the scanning signal lines S1, S2, S3, . . . , and Sm. For example, the scanning signal driver may sequentially provide a scanning signal with an on-level pulse to the scanning signal lines S1 to Sm. For example, the scanning signal driver may be constructed in a form of a shift register to generate a scanning signal in a manner of sequentially transmitting the scan starting signal provided in a form of an on-level pulse to a next-stage circuit under control of the clock signal, wherein m may be a natural number. The light-emitting signal driver may receive the clock signal, the light-emitting stopping signal, etc., from the timing controller to generate an emission signal to be provided to the light-emitting signal lines E1, E2, E3, . . . , and Eo. For example, the light-emitting signal driver may sequentially provide an emission signal with an off-level pulse to the light-emitting signal lines E1 to Eo. For example, the light-emitting signal driver may be constructed in a form of a shift register to generate a light-emitting signal in a manner of sequentially transmitting a light-emitting stopping signal provided in a form of an off-level pulse to a next-stage circuit under control of the clock signal, wherein o may be a natural number. The pixel array may include multiple sub-pixels Pxij, and at least one of the sub-pixels Pxij may include a pixel driving circuit and a light-emitting device, wherein the pixel driving circuit may be connected to a corresponding data signal line, a corresponding scanning signal line, and a corresponding light-emitting signal line. The pixel driving circuit is configured to, under control of the scanning signal line and the light-emitting signal line, receive a data voltage transmitted by the data signal line and output a corresponding current to the light-emitting device, and the light-emitting device is configured to emit light with corresponding brightness in response to a current output by a pixel driving circuit of a sub-pixel where the light-emitting device is located, wherein i and j may be natural numbers. A sub-pixel Pxij may refer to a sub-pixel whose pixel driving circuit therein is connected to an i-th scanning signal line and a j-th data signal line.

Figure 2:
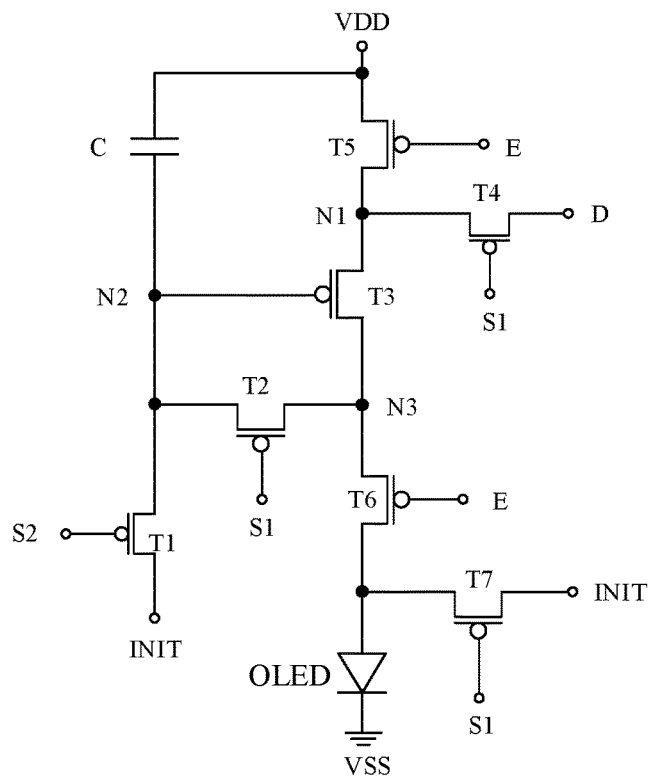
FIG. 2 is a schematic diagram of an equivalent circuit of a pixel driving circuit.

In an exemplary embodiment, the pixel driving circuit may be in a 3T1C, 4T1C, 5T1C, 5T2C, 6T1C, or 7T1C structure. FIG. 2 is a schematic diagram of an equivalent circuit of a pixel driving circuit. As shown in FIG. 2, the pixel driving circuit may include seven transistors (a first transistor T1 to a seventh transistor T7), one storage capacitor C, and seven signal lines (a data signal line D, a first scanning signal line S1, a second scanning signal line S2, a light-emitting signal line E, an initial signal line INIT, a first power supply line VDD, and a second power supply line VSS).

In an exemplary embodiment, a first terminal of the storage capacitor C is connected to the first power supply line VDD, and a second terminal of the storage capacitor C is connected to a second node N2, namely the second terminal of the storage capacitor C is connected to a control electrode of the third transistor T3.

A control electrode of the first transistor T1 is connected to the second scanning signal line S2, a first electrode of the first transistor T1 is connected to the initial signal line INIT, and a second electrode of the first transistor is connected to the second node N2. When a scanning signal with an on-level is applied to the second scanning signal line S2, the first transistor T1 transmits an initialization voltage to the control electrode of the third transistor T3 so as to initialize a charge amount of the control electrode of the third transistor T3.

A control electrode of the second transistor T2 is connected to the first scanning signal line S1, a first electrode of the second transistor T2 is connected to the second node N2, and a second electrode of the second transistor T2 is connected to a third node N3. When a scanning signal with an on-level is applied to the first scanning signal line S1, the second transistor T2 enables the control electrode of the third transistor T3 to be connected to the second electrode of the third transistor T3.

The control electrode of the third transistor T3 is connected to the second node N2, namely the control electrode of the third transistor T3 is connected to the second terminal of the storage capacitor C, a first electrode of the third transistor T3 is connected to a first node N1, and a second electrode of the third transistor T3 is connected to the third node N3. The third transistor T3 may be referred to as a driving transistor, and the third transistor T3 determines an amount of a driving current flowing between the first power supply line VDD and the second power supply line VSS according to a potential difference between the control electrode and the first electrode of the third transistor T3.

A control electrode of the fourth transistor T4 is connected to the first scanning signal line S1, a first electrode of the fourth transistor T4 is connected to the data signal line D, and a second electrode of the fourth transistor T4 is connected to the first node N1. The fourth transistor T4 may be referred to as a switch transistor, a scanning transistor, etc., and when a scanning signal with an on-level is applied to the first scanning signal line S1, the fourth transistor T4 enables a data voltage of the data signal line D to be input to the pixel driving circuit.

A control electrode of the fifth transistor T5 is connected to the light-emitting signal line E, a first electrode of the fifth transistor T5 is connected to the first power supply line VDD, and a second electrode of the fifth transistor T5 is connected to the first node N1. A control electrode of the sixth transistor T6 is connected to the light-emitting signal line E, a first electrode of the sixth transistor T6 is connected to the third node N3, and a second electrode of the sixth transistor T6 is connected to a first electrode of the light-emitting device. The fifth transistor T5 and the sixth transistor T6 may be referred to as light-emitting transistors. When a light-emitting signal with an on-level is applied to the light-emitting signal line E, the fifth transistor T5 and the sixth transistor T6 enable the light-emitting device to emit light by forming a driving current path between the first power supply line VDD and the second power supply line VSS.

A control electrode of the seventh transistor T7 is connected to the first scanning signal line S1, a first electrode of the seventh transistor T7 is connected to the initial signal line INIT, and a second electrode of the seventh transistor T7 is connected to the first electrode of the light-emitting device. When a scanning signal with an on-level is applied to the first scanning signal line S1, the seventh transistor T7 transmits an initialization voltage to the first electrode of the light-emitting device so as to initialize a charge amount accumulated in the first electrode of the light-emitting device or release a charge amount accumulated in the first electrode of the light-emitting device.

In an exemplary embodiment, a second electrode of the light-emitting device is connected to the second power supply line VSS, a signal of the second power supply line VSS is a low-level signal, and a signal of the first power supply line VDD is a high-level signal continuously provided. The first scanning signal line S1 is a scanning signal line in the pixel driving circuit of a current display row, and the second scanning signal line S2 is a scanning signal line in the pixel driving circuit of a previous display row. That is, for an n-th display row, the first scanning signal line S1 is S(n), and the second scanning signal line S2 is S(n−1). The second scanning signal line S2 of the current display row and the first scanning signal line S1 in the pixel driving circuit of the previous display row are the same signal line, thus signal lines of the display panel may be reduced, so that the display panel has a narrow bezel.

In an exemplary embodiment, the first transistor T1 to the seventh transistor T7 may be P-type transistors or N-type transistors. Use of the same type of transistors in a pixel driving circuit may simplify a process flow, reduce process difficulties of a display panel, and improve a product yield.

In some possible embodiments, the first transistor T1 to the seventh transistor T7 may include P-type transistors and N-type transistors.

In an exemplary embodiment, the first scanning signal line S1, the second scanning signal line S2, the light-emitting signal line E, and the initial signal line INIT extend in a horizontal direction, and the second power supply line VSS, the first power supply line VDD, and the data signal line D extend in a vertical direction.

In an exemplary embodiment, the light-emitting device may be an Organic light-emitting Diode (OLED), including a first electrode (anode), an organic light-emitting layer, and a second electrode (cathode) that are stacked.

Figure 3:
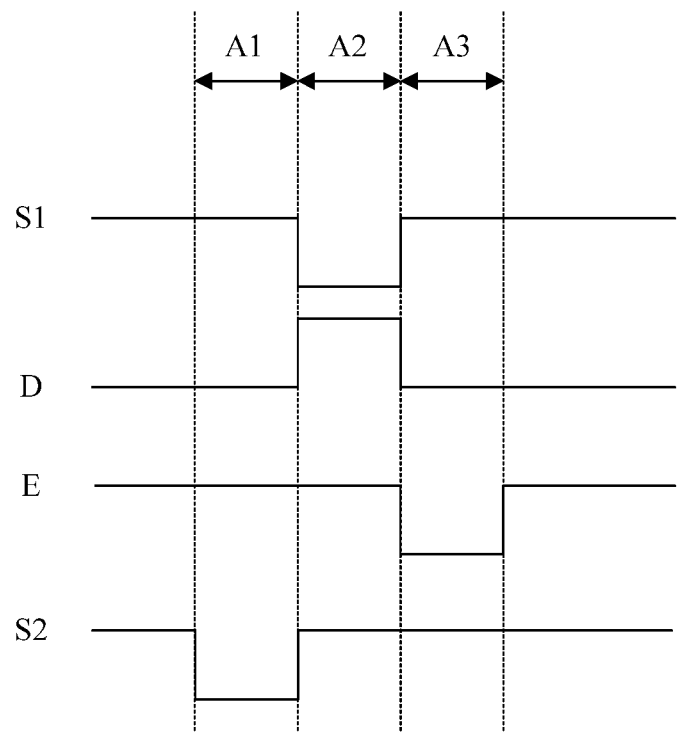
FIG. 3 is an operation timing diagram of a pixel driving circuit.

FIG. 3 is an operation timing diagram of a pixel driving circuit. An exemplary embodiment of the present disclosure will be described below through a working process of the pixel driving circuit shown in FIG. 2. The pixel driving circuit in FIG. 2 includes seven transistors (a first transistor T1 to a seventh transistor T7), one storage capacitor C, and seven signal lines (a data signal line D, a first scanning signal line S1, a second scanning signal line S2, a light-emitting signal line E, an initial signal line INIT, a first power supply line VDD, and a second power supply line VSS), wherein all of the seven transistors are P-type transistors.

In an exemplary embodiment, the working process of the pixel driving circuit may include following stages.

In a first stage A1, referred to as a reset stage, a signal of the second scanning signal line S2 is a low-level signal, and signals of the first scanning signal line S1 and the light-emitting signal line E are high-level signals. The signal of the second scanning signal line S2 is the low-level signal, so that the first transistor T1 is turned on, and a signal of the initial signal line INIT is provided to a second node N2 to initialize the storage capacitor C to clear an original data voltage in the storage capacitor. The signals of the first scanning signal line S1 and the light-emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scanning signal line S1 is a low-level signal, the signals of the second scanning signal line S2 and the light-emitting signal line E are high-level signals, and the data signal line D outputs a data voltage. In this stage, a second terminal of the storage capacitor C is at a low level, so that the third transistor T3 is turned on. The signal of the first scanning signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light.

The signal of the second scanning signal line S2 is the high-level signal, so that the first transistor T1 is turned off. The signal of the light-emitting signal line E is the high-level signal, so that the fifth transistor T5 and the sixth transistor T6 are turned off.

In a third stage A3, referred to as a light-emitting stage, the signal of the light-emitting signal line E is a low-level signal, and the signals of the first scanning signal line S1 and the second scanning signal line S2 are high-level signals. The signal of the light-emitting signal line E is the low-level signal, so that the fifth transistor T5 and the sixth transistor T6 are turned on, and a power voltage output by the first power supply line VDD provides a driving voltage to the first electrode of the OLED through the turned-on fifth transistor T5, the third transistor T3, and the sixth transistor T6 to drive the OLED to emit light.

In a driving process of the pixel driving circuit, a driving current flowing through the third transistor T3 (driving transistor) is determined by a voltage difference between a gate electrode and a first electrode of the third transistor T3. A voltage of the second node N2 is Vdata−|Vth|, so that the driving current of the third transistor T3 is as follows.

$$I=K*(Vgs-Vth)^2=K*[(Vdd-Vd+|Vth|)-Vth]^2=K*[(Vdd-Vd]^2$$

I is the driving current flowing through the third transistor T3, i.e., a driving current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the first power supply line VDD.

Figure 4:
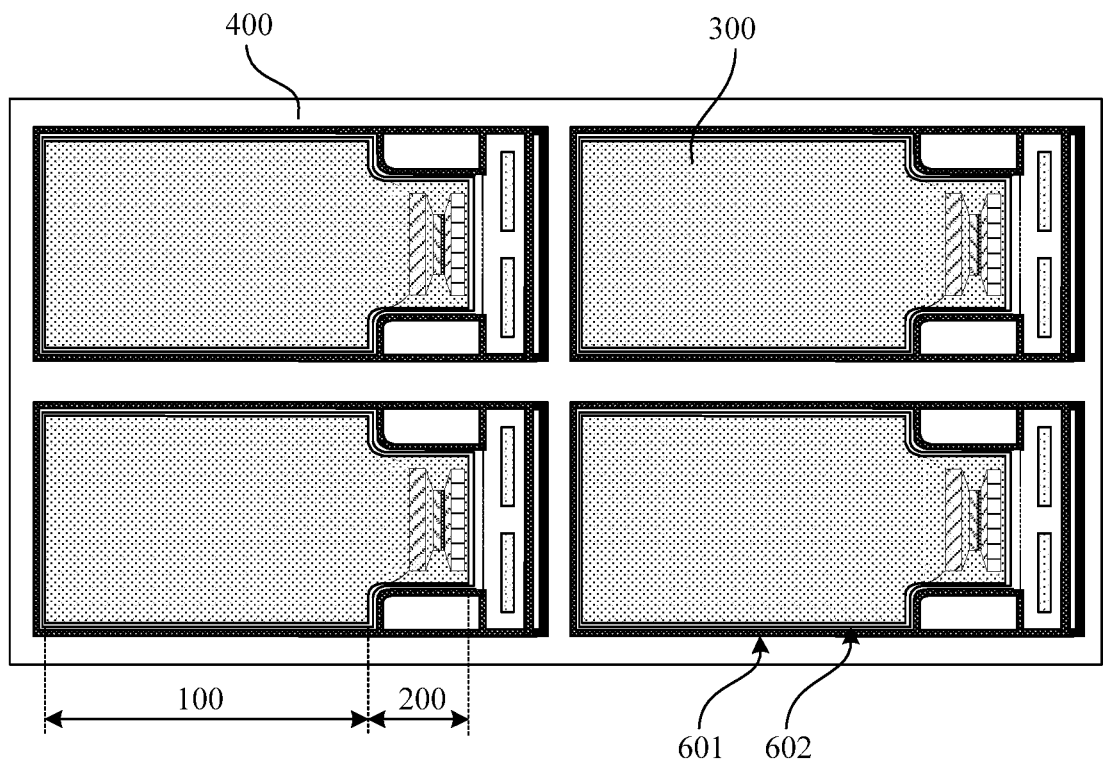
FIG. 4 is a schematic diagram of a structure of a display mother plate according to an exemplary embodiment of the present disclosure.

At present, a flexible OLED display device is manufactured by firstly manufacturing a display mother plate and then cutting the display mother plate, so that the display mother plate is divided into multiple display panels, and each of the separated display panels can be used for forming a single OLED display device. FIG. 4 is a schematic diagram showing an arrangement of multiple display panels included in a display mother plate. As shown in FIG. 4, multiple substrate regions 300 on the display mother plate are periodically and regularly arranged, and a cutting region 400 is located outside the substrate regions 300. A substrate region 300 at least includes an effective region 100 and a bonding region 200, wherein the effective region 100 includes multiple pixels arranged in a matrix, and the bonding region 200 is provided on one side of the effective region 100. A first cutting line 601 and a second cutting line 602 are provided in the cutting region 400. After all film layers of the display mother plate are manufactured, the cutting equipment performs rough cutting along the first cutting line 601 and performs fine cutting along the second cutting line 602 respectively to form a display panel.

Figure 5:
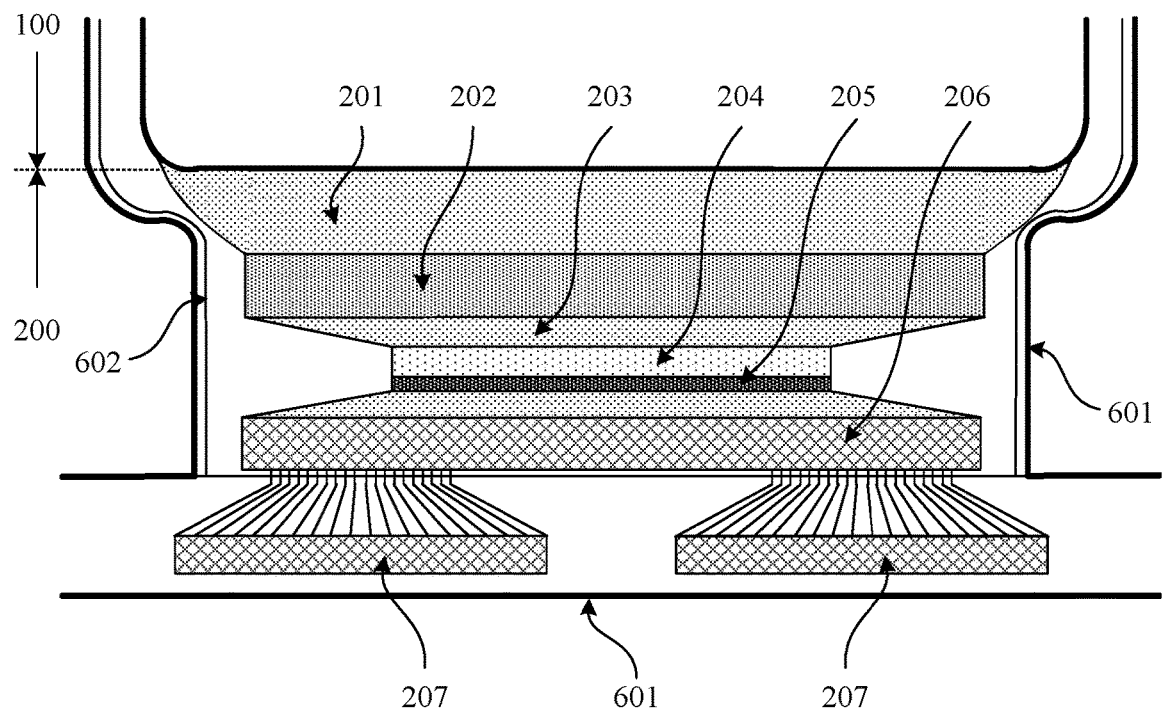
FIG. 5 is a schematic diagram of a structure of a peripheral region of a display panel according to an exemplary embodiment of the present disclosure.

In an exemplary embodiment, as shown in FIG. 5, a bonding region 200 may include a first fanout area 201, a bending area 202, a second fanout area 203, an anti-static area 204, a driver chip area 205, and a bonding pin region 206 that are provided sequentially along a direction away from the effective region 100. The first fan-out region 201 may be provided with signal transmission lines of the display unit and touch leads of the touch unit. The signal transmission lines of the display unit at least include a first power supply line (VDD), a second power supply line (VSS) and multiple data transmission lines. The multiple data transmission lines are configured to be connected to data lines of the display unit in a fan-out manner. The first power supply line VDD is configured to be connected to a high-level power supply line of the display unit and the second power supply line VSS is configured to be connected to a low-level power supply line of the display unit. The multiple touch leads of the touch unit are configured to be correspondingly connected to multiple pins of the bonding pin region 206. A groove may be formed in the bending region 202. The groove is configured to bend the second fan-out region 203, the anti-static region 204, the driving chip region 205, and the bonding pin region 206 to a back surface of the effective region 100. The second fan-out region 203 may be provided with multiple touch leads and multiple data transmission lines which are led out in a fan-out manner. An anti-static circuit may be provided in the anti-static region 204. The anti-static circuit is configured to eliminate static electricity. A source driving circuit (Driver IC) may be provided in the driving chip region 205. The source driving circuit is configured to be connected to the multiple data transmission lines in the second fan-out region 203. In some possible implementation modes, the driver chip region 205 may be provided with a touch and display driver integration (TDDI) circuit. The bonding pin region 206 may be provided with multiple pins, which are correspondingly connected to the multiple touch leads and multiple signal transmission lines of the source driving circuit, and are connected to an external control device through a bound flexible printed circuit board (FPC).

In an exemplary embodiment, in a process of manufacturing the display unit and the touch unit, an array test region is further provided on one side of the bonding region 200 away from the effective region 100, and the array test region includes an array test unit 207. The array test unit 207 includes multiple test terminals (ET Pad) which are correspondingly connected to multiple pins or test signal lines of the bonding pin region 206 through interface lines, and are configured to test the display unit and the touch unit to check whether there is a problem such as short circuit, open circuit, or the like.

In an exemplary embodiment, a first cutting line 601 and a second cutting line 602 are provided outside the bonding region 200. The second cutting line 602 is a fine cutting line which is located at the periphery of the bonding region 200 and the second cutting line 602 has a same shape as an outline of the bonding region 200. The first cutting line 601 is a rough cutting line which is located at the periphery of the second cutting line 602 and the first cutting line 601 has the substantially same shape as the outline of the second cutting line 602. However, only the second cutting line 602 is provided between the bonding region 200 and the array test unit 207. At least one first cutting line 601 is further provided on one side of the array test unit 207 away from the bonding region 200. After a film layer process is completed, cutting equipment cuts along the first cutting line 601 (rough cutting line), and after a test is completed, the cutting equipment cuts along the second cutting line 602 (fine cutting line), such that the display panel is formed.

Compared with the way of separately driving touch and display, design of TDDI products often encounters the problem of limited space. Therefore, it is necessary to design the signal routing after the integration of touch and display. In the routing design of the bonding region 200, it is necessary to lead some test signal lines through the bonding pin region 206 to the array test unit 207 for test connection. However, the test signal lines are easy to be pressed to be broken during the bonding process, and film layer peeling is easy to occur at the positions of the test signal lines during the process.

An exemplary embodiment of the present disclosure provides a display panel, which may include an effective region and a bonding region located on one side of the effective region, wherein the bonding region includes a bonding pin region including a bonding pin, a virtual pin and test signal lines. An orthographic projection of at least one of the test signal lines on the base substrate is within a range of an orthographic projection of the virtual pin on the base substrate, and the orthographic projection of the virtual pin on the base substrate does not overlap with an orthographic projection of the bonding pin on the base substrate.

In some exemplary embodiments, the effective region includes a base substrate and a display unit and a touch unit which are stacked on the base substrate. The display unit includes multiple data lines and multiple gate lines, multiple sub-pixels are defined by intersection of the multiple data lines and the multiple gate lines. The touch unit includes multiple touch electrodes and touch leads connected to the touch electrodes.

The display panel further includes an array test region located on a side of the bonding region away from the effective region, the array test region includes test pins, wherein the test signal lines are connected to the test pins and are configured to test one or more of the display unit and the touch unit.

Figure 6A:
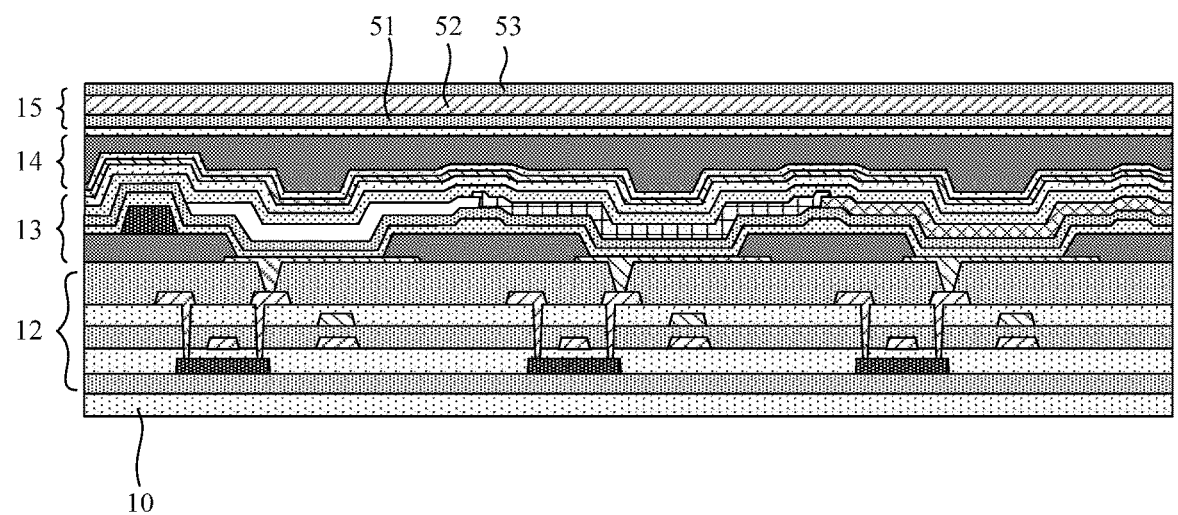
FIGS. 6a and 6b are cross-sectional structural diagrams of effective regions of two display panels according to an exemplary embodiment of the present disclosure.
Figure 6B:
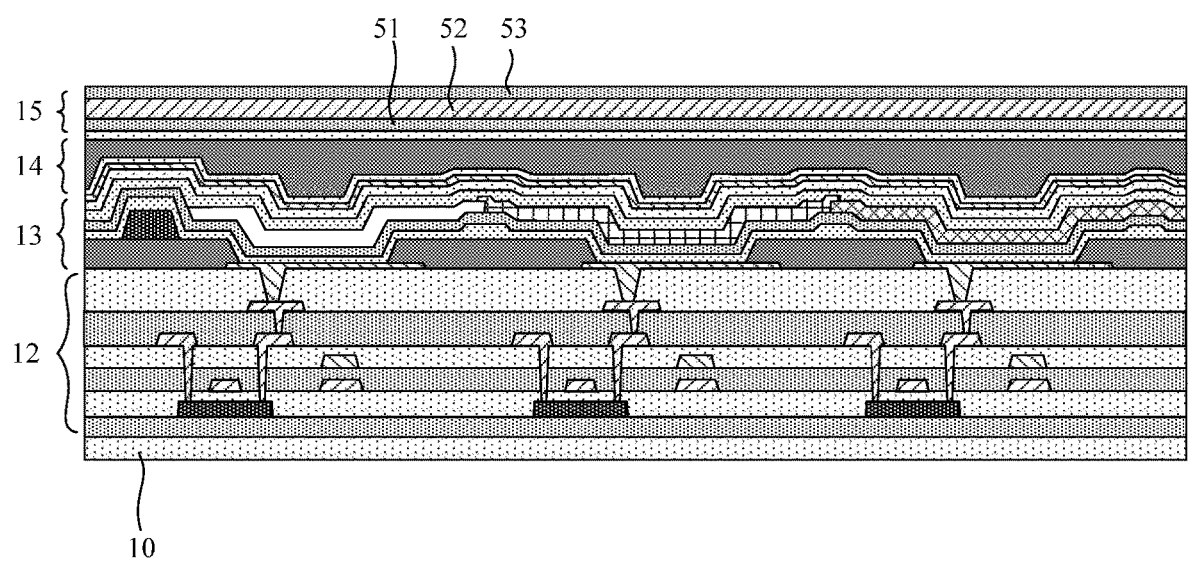

FIGS. 6a and 6b are cross-sectional structural diagrams of effective regions of two display panels according to an exemplary embodiment of the present disclosure, which show a structure of three sub-pixels in an OLED display panel. As shown in FIGS. 6a and 6b, in a plane perpendicular to the display panel, the display panel may include a driving circuit layer 12 provided on a base substrate 10, a light-emitting structure layer 13 provided at a side of the driving circuit layer 12 away from the base substrate 10, an encapsulation layer 14 provided at a side of the light-emitting structure layer 13 away from the base substrate 10, and a touch structure layer 15 provided at a side of the encapsulation layer 14 away from the base substrate 10. The touch structure layer 15 may include a touch insulating layer 51 provided at a side of the encapsulation layer 14 away from the base substrate 10, a touch electrode layer 52 provided at a side of the touch insulating layer 51 away from the base substrate 10, and a touch protective layer 53 provided at a side of the touch electrode layer 52 away from the base substrate 10.

At present, Touch on TFE structures mainly include a Flexible Multi Layer On Cell (FMLOC for short) structure and a Flexible Single Layer On Cell (FSLOC for short) structure. The FMLOC structure is based on a working principle of mutual capacitance detection, wherein a driving (Tx) electrode and a sensing (Rx) electrode are generally formed by using two layers of metal, and an Integrated Circuit (IC) achieves a touch action by detecting mutual capacitance between the driving electrode and the sensing electrode. The FSLOC structure is based on a working principle of self-capacitance (or voltage) detection, wherein a touch electrode is generally formed by using a single layer of metal, and an integrated circuit achieves a touch action by detecting self-capacitance (or voltage) of the touch electrode. The touch structure layer 15 in the embodiment of the present disclosure may be an FMLOC structure or an FSLOC structure.

Figure 6C:
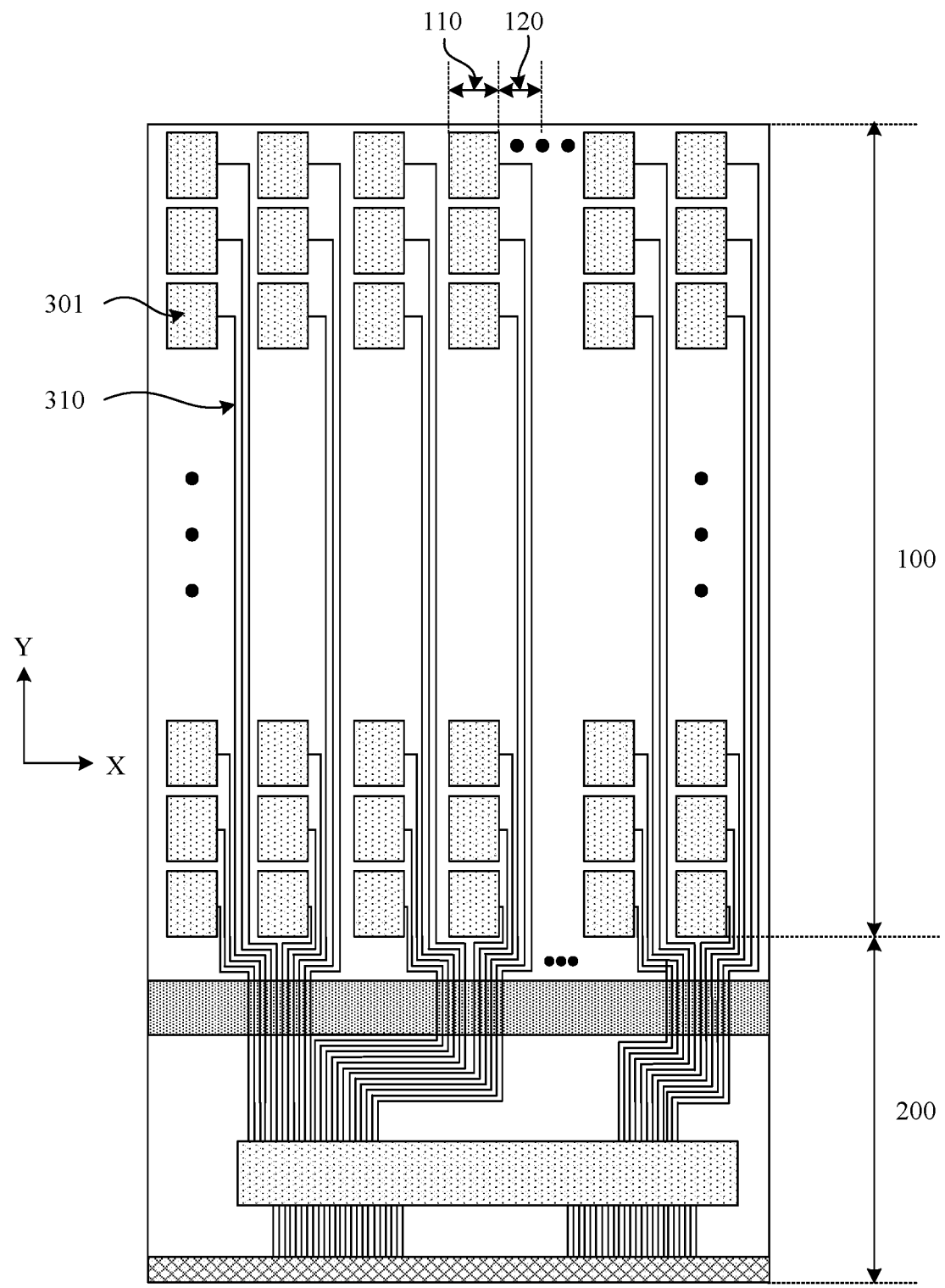
FIGS. 6c and 6d are schematic diagrams of planar structures of two touch units according to an exemplary embodiment of the present disclosure.

In an exemplary embodiment, as shown in FIG. 6c, the effective region 100 includes multiple touch electrodes 301 provided regularly. Exemplarily, the touch electrodes 301 may be rectangular and provided in a matrix of M*N. The effective region 100 may be divided into N electrode regions 110 and N lead regions 120. The electrode regions 110 and the lead regions 120 are strip-shaped regions extending along a second direction Y, and the strip-shaped electrode regions 110 and the strip-shaped lead regions 120 are alternately provided along a first direction X, i.e., except electrode regions and lead regions at edge positions, one lead region 120 is provided between two electrode regions 110 and one electrode region 110 is provided between two lead regions 120. Each electrode region 110 includes M touch electrodes 301 provided sequentially along the second direction Y, and each lead region 120 includes M touch leads 310 provided sequentially along the first direction X. A first end of each touch lead 310 is connected to one touch electrode 300, and its second end extends to the bonding region 200 along the second direction Y.

In some exemplary embodiments, the touch electrodes 301 may be of a regular pattern of about 4 mm*4 mm or 5 mm*5 mm, which may be a rectangle, a rhombus, a triangle or a polygon. During operation, a touch by a finger of a person will cause self-capacitance of a corresponding touch electrode to change, and an external control device may determine a position of the finger according to the change of the capacitance of the touch electrode.

Figure 6D:
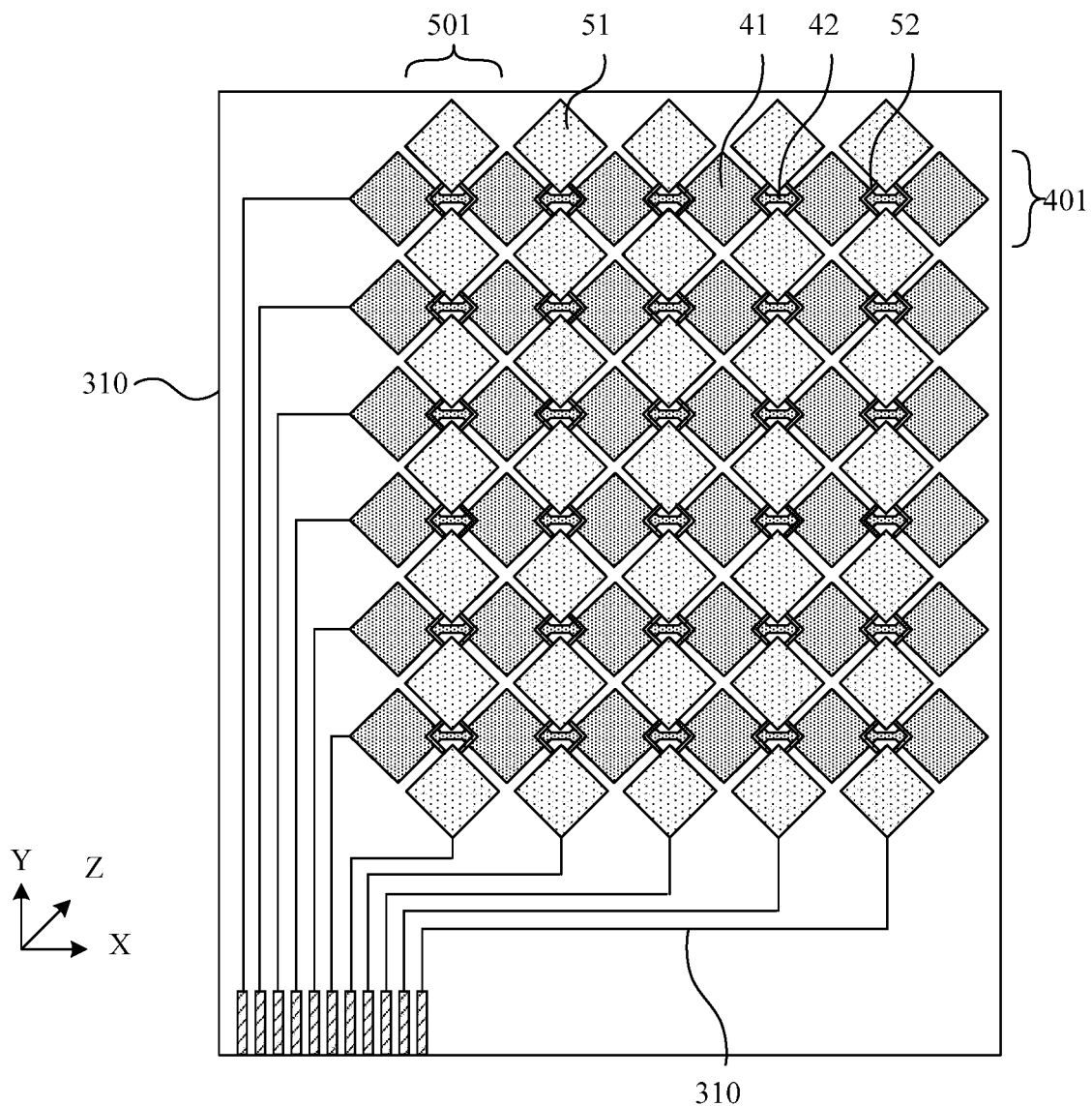

In other exemplary embodiments, as shown in FIG. 6d, the touch structure layer includes multiple first touch units 401 and multiple second touch units 501, wherein the first touch units 401 have a linear shape extending along a first direction X and the multiple first touch units are provided sequentially along a second direction Y. The second touch units 501 have a linear shape extending along the second direction Y and the multiple the second touch units 501 are provided sequentially along the first direction X. The first direction X intersects with the second extending direction Y.

Each first touch unit 401 includes multiple first touch electrodes 41 and first connecting portions 42 provided sequentially along the first direction X, wherein the multiple first touch electrodes 41 and the multiple first connecting portion 42 are alternately provided and sequentially coupled. Each second touch unit 501 includes multiple second touch electrodes 51 provided sequentially along the second direction Y, wherein the multiple second touch electrodes 51 are provided at intervals, and adjacent second touch electrodes 51 are connected to each other via second connecting portions 52. A layer on which the second connecting portions 52 are located is different from layers on which the first touch electrodes 41 and the second touch electrodes 51 are located. The first touch electrodes 41 and the second touch electrodes 51 are alternately arranged along a third direction D3, and the third direction D3 intersects with the first direction X and the second direction Y.

The first touch unit 401 and the second touch unit 501 are connected to touch pins of the bonding region 200 through the touch leads 310. In an exemplary embodiment, the touch pins of the bonding region 200 are connected to a driver, and the driver may apply driving signals to the second touch electrodes 51 and receive output signals from the first touch electrodes 41, or the driver may apply driving signals to the first touch electrodes 41 and receives output signals from the second touch electrodes 51. The driver may determine a position where touching occurs by detecting inductive signals generated in the multiple electrodes when different electrodes transmit touch signals.

In an exemplary embodiment, the touch electrode layer 52 includes a first touch electrode layer (i.e., a bridge layer), a sixth insulating layer and a second touch electrode layer which are stacked on the touch insulating layer 51. The multiple first touch electrodes 41, the multiple second touch electrodes 51, and the multiple first connecting portions 42 may be provided on a same layer, i.e., a second touch electrode layer, and may be formed through a same patterning process, and the first touch electrodes 41 and the first connecting portions 42 may be connected to each other and be of an integrated structure. The second connecting portions 52 may be provided on the first touch electrode layer, and adjacent second touch electrodes 51 are connected to each other through a via. An insulating layer is provided between the second touch electrode layer and the first touch electrode layer. In some possible implementation modes, the multiple first touch electrodes 41, the multiple second touch electrodes 51, and the multiple second connecting portions 52 may be provided on a same layer, i.e., the second touch electrode layer, and the second touch electrodes 51 and the second connecting portions 52 may be connected to each other and be of an integrated structure. The first connecting portions 42 may be provided on the first touch electrode layer, and adjacent first touch electrodes 41 are connected to each other through a via. In an exemplary embodiment, the first touch electrodes may be driving electrodes (Tx) and the second touch electrodes may be sensing electrodes (Rx). Or, the first touch electrodes may be sensing electrodes (Rx) and the second touch electrodes may be driving electrodes (Tx).

Figure 7:
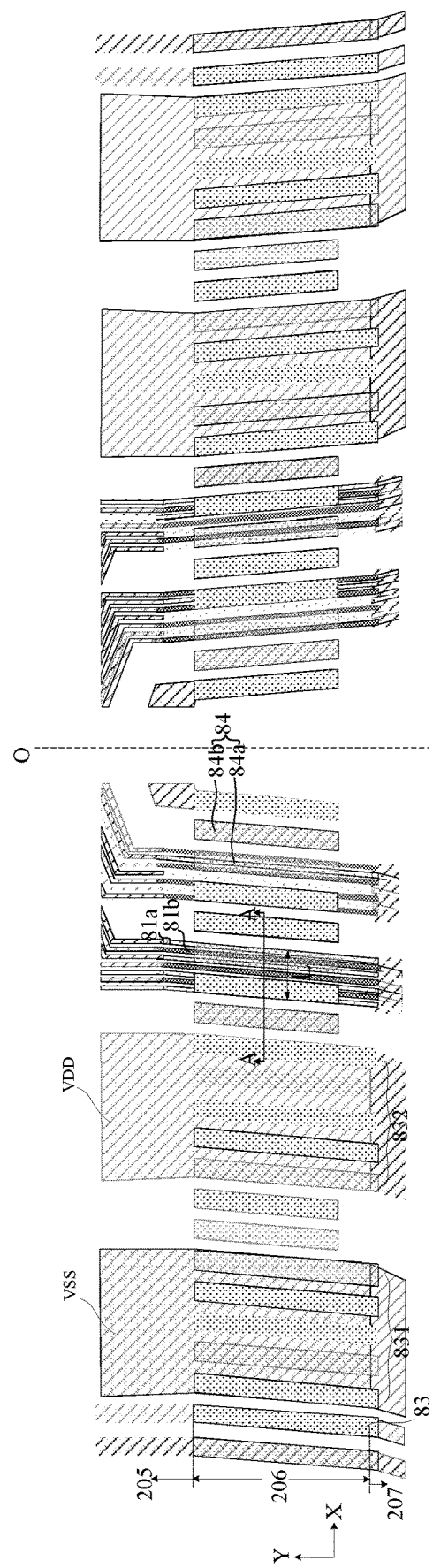
FIG. 7 is a schematic diagram of a planar structure of a bonding pin region of a display panel according to an exemplary embodiment of the present disclosure.
Figure 8:
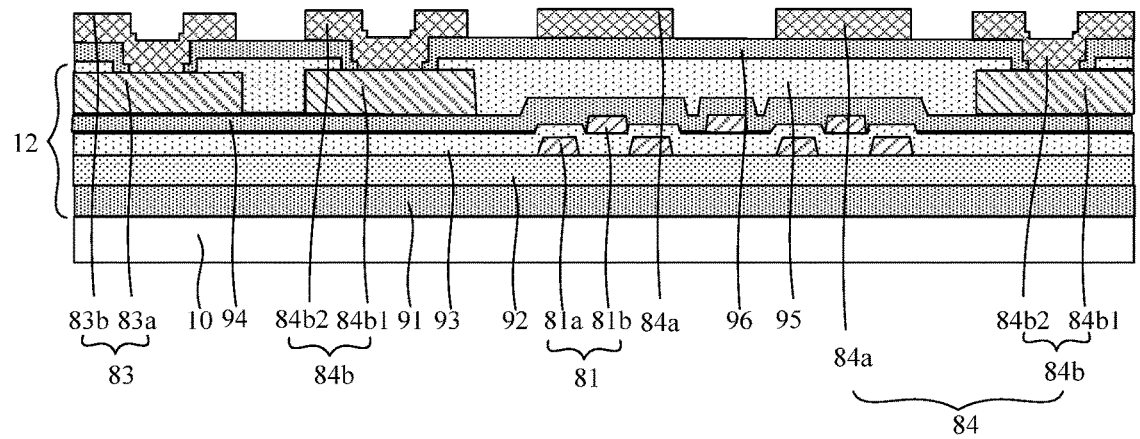
FIG. 8 is a schematic sectional diagram of a structure of a region AA in FIG. 7.

FIG. 7 is a schematic diagram of a planar structure of a bonding pin region of a display panel according to an exemplary embodiment of the present disclosure. FIG. 8 is a schematic sectional structure diagram of a region AA in FIG. 7. Referring to FIGS. 5, 7 and 8, an embodiment of the present disclosure provides a display panel, including an effective region 100, a bonding region 200 located on one side of the effective region 100, and an array test region located on a side of the bonding region 200 away from the effective region 100. The effective region includes a base substrate 10 and a display unit and a touch unit which are stacked on the base substrate 10, the display unit includes multiple data lines, multiple gate lines, and multiple sub-pixels, and the touch unit includes multiple touch electrodes and touch leads connected to the touch electrodes.

The bonding region 200 includes a bonding pin region 206, wherein the bonding pin region 206 includes bonding pins 83, virtual pins 84 and test signal lines 81. The array test region includes test pins (not shown in the figure). The test signal lines 81 are connected to the test pins, and are configured to test the display unit and/or the touch unit.

An orthographic projection of at least one test signal line 81 on the base substrate 10 is within a range of an orthographic projection of a virtual pin 84 on the base substrate 10, and the orthographic projection of the virtual pins 84 on the base substrate 10 does not overlap with an orthographic projection of the bonding pins 83 on the base substrate 10.

In an exemplary embodiment, as shown in FIGS. 7 and 8, the virtual pins 84 include a first virtual pin 84a and a second virtual pin 84b. An orthographic projection of the first virtual pin 84a on the base substrate 10 does not overlap with an orthographic projection of the second virtual pin 84b on the base substrate 10. The orthographic projection of at least one test signal line 81 on the base substrate 10 is within a range of an orthographic projection of the first virtual pin 84a on the base substrate 10, and the orthographic projection of the test signal line 81 on the base substrate 10 does not overlap with an orthographic projection of the second virtual pin 84b on the base substrate 10.

In an exemplary embodiment, as shown in FIGS. 7 and 8, in a plane perpendicular to the display panel, the display panel includes a first conductive layer provided on the base substrate 10, a second conductive layer provided on the first conductive layer, a third conductive layer provided on the second conductive layer, and a fourth conductive layer provided on the third conductive layer.

The test signal lines 81 are provided in a same layer as at least one of the first conductive layer and the second conductive layer.

The first virtual pin 84a is provided in a same layer as the fourth conductive layer.

The bonding pins and the second virtual pin 84b are provided in a same layer as the third conductive layer and the fourth conductive layer, respectively.

In an exemplary embodiment, as shown in FIGS. 6a, 7 and 8, the driving circuit layer 12 may include a base substrate 10, and a first insulating layer, an active layer, a second insulating layer, a first gate metal layer, a third insulating layer, a second gate metal layer, a fourth insulating layer, and a first source-drain metal layer which are stacked on the base substrate 10.

The first conductive layer may be provided in a same layer as the first gate metal layer, the second conductive layer may be provided in a same layer as the second gate metal layer, the third conductive layer may be provided in a same layer as the first source-drain metal layer, and the fourth conductive layer may be provided in a same layer as the touch electrode layer.

In an exemplary embodiment, in a case that the touch electrode layer includes a first touch electrode layer, a sixth insulating layer, and a second touch electrode layer stacked on the touch insulating layer, the fourth conductive layer may be provided in a same layer as the first touch electrode layer and the second touch electrode layer, or the fourth conductive layer may be provided in a same layer as the second touch electrode layer. Since a thickness of the first touch electrode layer may be different from that of the second touch electrode layer and the thickness of the second touch electrode layer is usually greater than that of the first touch electrode layer, by arranging the fourth conductive layer and the second touch electrode layer in the same layer, the heights of the bonding pins and the second virtual pin 84b may be increased, thereby further ensuring that the test signal line at the bottom of the first virtual pin will not be pressed to be broken.

In an exemplary embodiment, as shown in FIGS. 6b, 7 and 8, the driving circuit layer 12 may include a base substrate 10, and a first insulating layer, an active layer, a second insulating layer, a first gate metal layer, a third insulating layer, a second gate metal layer, a fourth insulating layer, a first source-drain metal layer, a fifth insulating layer and a second source-drain metal layer which are stacked on the base substrate 10.

The first conductive layer may be provided in a same layer as the first gate metal layer, the second conductive layer may be provided in a same layer as the second gate metal layer, the third conductive layer may be provided in a same layer as one or more of the first source-drain metal layer and the second source-drain metal layer, and the fourth conductive layer may be provided in a same layer as the touch electrode layer.

In an exemplary embodiment, as shown in FIGS. 7 and 8, the test signal lines 81 includes a first test signal line 81a located on the first conductive layer and a second test signal line 81b located on the second conductive layer.

An orthographic projection of the first test signal line 81a on the base substrate 10 does not overlap with an orthographic projection of the second test signal line 81b on the base substrate 10, the first test signal line 81a and the second test signal line 81b both extend in a second direction Y, the first test signal line 81a and the second test signal line 81b are alternately provided in a first direction X, wherein the first direction X intersects with the second direction Y.

Figure 9:
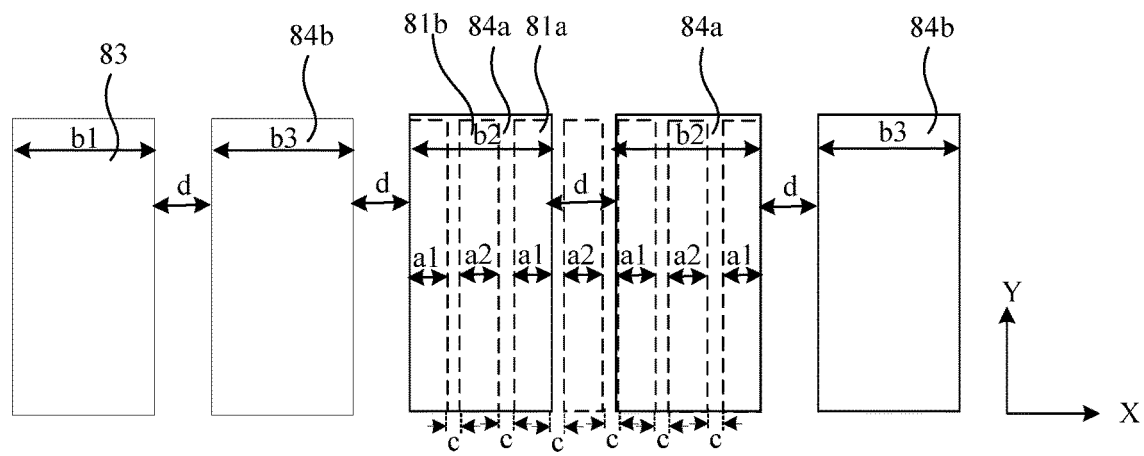
FIG. 9 is a schematic diagram of widths of pins and test signal lines and distances theretween according to an exemplary embodiment of the present disclosure.

In an exemplary embodiment, as shown in FIG. 9, a width a1 of the first test signal line 81a along the first direction X is equal to a width a2 of the second test signal line 81b along the first direction X, and a distance between adjacent first test signal line 81a and second test signal line 81b is equal.

In this embodiment, the stability and consistency of the bonding process are ensured by arranging the first test signal lines 81a and the second test signal lines 81b with equal width and equal interval. However, in an actual products, due to the existence of process errors, a certain process error range is allowed in the widths of the first test signal line 81a and the second test signal line 81b relative to a standard signal line width, or in the interval between the first test signal line 81a and the second test signal line 81b relative to a standard signal line interval. Exemplarily, the process error range may be 0.1 micron to 0.8 micron. Therefore, as long as the widths of the first test signal line 81a and the second test signal line 81b are within the process error range, or the interval between the first test signal lines 81a and the second test signal lines 81b is within the process error range, the first test signal line 81a and the second test signal line 81b are considered to be arranged with equal width or equal interval.

In an exemplary embodiment, the width of the first test signal line 81a along the first direction X is between 7 microns and 17 microns, and the distance between adjacent first test signal lines 81a and second test signal lines 81b is between 8 microns and 18 microns.

In an exemplary embodiment, as shown in FIG. 9, the width b1 of the bonding pin 83 along the first direction X, the width b2 of the first virtual pin 84a along the first direction X, and the width b3 of the second virtual pin 84b along the first direction X are equal, and a distance between two adjacent pins is equal. Exemplarily as shown in FIG. 9, two adjacent pins refer to any two pins that are physically adjacent.

In this embodiment, the stability and consistency of the bonding process are ensured by arranging the bonding pins 83 and the virtual pins 84 with equal width and equal interval. However, in an actual product, due to the existence of process errors, a certain process error range is allowed in the widths of the bonding pins 83 and the virtual pins 84 relative to the standard pin width, or in the interval between the bonding pin 83 and the virtual pin 84 relative to the standard pin interval. Exemplarily, the process error range may be 0.1 micron to 0.8 micron. Therefore, as long as the widths of the bonding pins 83 and the virtual pins 84 are within the process error range, or the interval between the bonding pin 83 and the virtual pin 84 is within the process error range, the bonding pins 83 and the virtual pins 84 are considered to be provided with equal width or equal interval.

In an exemplary embodiment, the width b1 of a bonding pin 83 along the first direction X is between 45 microns and 75 microns and the distance between two adjacent pins is between 25 microns and 55 microns.

In an exemplary embodiment, a length of the bonding pin 83 along the second direction Y is equal to the length of a virtual pin 84 along the second direction Y, and the length of the bonding pin 83 along the second direction Y is between 900 microns and 1000 microns.

In an exemplary embodiment, as shown in FIG. 9, a width of the orthographic projection of the first virtual pin 84a on the base substrate 10 along the first direction X is equal to a width of the orthographic projection of the M test signal lines 81 on the base substrate 10 along the first direction X, a distance between two adjacent pins is greater than a width of the N test signal lines 81 along the first direction X, wherein M is a natural number greater than or equal to 1, and N is a natural number greater than or equal to 1. In this embodiment, the width of the orthographic projection of the M test signal lines 81 on the base substrate 10 along the first direction X includes a sum of the widths of the M test signal lines 81 themselves and the widths of the intervals between two adjacent test signal lines 81 among the M test signal lines 81. The width of the N test signal lines 81 along the first direction X includes a sum of the widths of the N test signal lines 81 themselves and the widths of the intervals between two adjacent test signal lines 81 among the N test signal lines 81.

In an exemplary embodiment, M is 3, and N is 1.

In an exemplary embodiment, x first virtual pins 84a are provided between two second virtual pins 84b, where x is a natural number between 1 and 3.

In an exemplary embodiment, as shown in FIG. 7, the display panel further includes a first power supply line VDD and a second power supply line VSS, 2n test signal lines include are provided, the bonding pins 83 include multiple first bonding pins 831 and multiple second bonding pins 832. The multiple first bonding pins 831 are connected to the first power supply line VDD, the multiple second bonding pins 832 are connected to the second power supply line VSS, the 2n test signal lines are provided between multiple second bonding pins 832, the multiple second bonding pins 832 are provided between multiple first bonding pins 831, the 2n test signal lines are provided symmetrically along a center line O of the bonding region, the multiple first bonding pins 831 are provided symmetrically along the center line O of the bonding region, and the multiple second bonding pins 832 are provided symmetrically along the center line O of the bonding region.

In an exemplary embodiment, as shown in FIG. 7, n test signal lines are divided into at least two test signal line groups on one side of the center line O of the bonding region, and at least one virtual pin 84 is provided between two adjacent test signal line groups.

In an exemplary embodiment, as shown in FIG. 7, a width L of the orthographic projection of at least one test signal line group on the base substrate along the first direction X is between 150 microns and 300 microns.

In this embodiment, the width of the orthographic projection of the test signal line group on the base substrate along the first direction X includes a sum of the widths of all the test signal lines 81 themselves in the test signal line group and the widths of the interval between two adjacent test signal lines 81.

A manufacturing process of the display panel will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate through a process such as depositing, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" after the patterning process includes at least one "pattern". "A and B are provided on a same layer" described in the present disclosure means that A and B are formed at the same time through a same patterning process, and a "thickness" of a film layer is a dimension of the film layer in a direction perpendicular to a display panel. In an exemplary embodiment of the present disclosure, "an orthographic projection of B is within the range of an orthographic projection of A" refers to that a boundary of the orthographic projection of B falls within a boundary range of the orthographic projection of A, or the boundary of the orthographic projection of A overlaps with the boundary of the orthographic projection of B.

In an exemplary embodiment, the manufacturing process of the display panel includes the following operations.

(1) A base substrate 10 is manufactured on a glass carrier plate. In an exemplary embodiment, the base substrate 10 may include a first flexible material layer, a first inorganic material layer, a semiconductor layer, a second flexible material layer and a second inorganic material layer stacked on the glass carrier plate. Materials of the first and second flexible material layers may be polyimide (PI), polyethylene terephthalate (PET), or a polymer soft film subjected to surface treatment, etc. Materials of the first and second inorganic material layers may be silicon nitride (SiNx), silicon oxide (SiOx), or the like, so as to improve water-oxygen resistance capability of the base substrate. The first and second inorganic material layers are also referred to as barrier layers. A material of the semiconductor layer may be amorphous silicon (a-si). In an exemplary embodiment, the base substrate 10 may be a rigid base substrate. After this process, the bonding pin region 206 includes the base substrate 10.

(2) A pattern of a driving circuit layer 12 is formed on the base substrate 10. In an exemplary embodiment, the formation of the pattern of the driving circuit layer may include the following operations.

Figure 10:
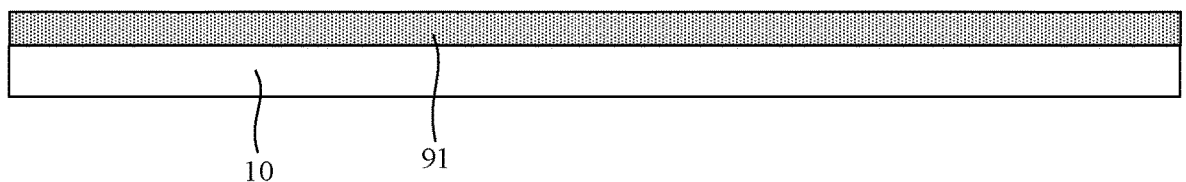
FIG. 10 is a schematic diagram of an exemplary structure of a bonding pin region of a display panel after a semiconductor layer is formed according to the present disclosure.

A first insulating thin film and a semiconductor thin film are sequentially deposited on the base substrate 10. The semiconductor thin film is patterned by a patterning process to form a first insulating layer covering the base substrate 10 and a pattern of a semiconductor layer provided on the first insulating layer. The pattern of the semiconductor layer at least includes an active layer in each display sub-pixel. After this patterning process, as shown in FIG. 10, the bonding pin region 206 includes a first insulating layer 91 provided on the base substrate 10.

Figure 11:
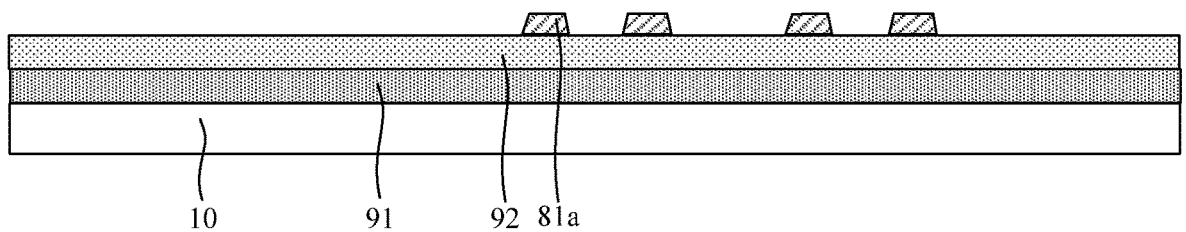
FIG. 11 is a schematic diagram of an exemplary structure of a bonding pin region of a display panel after a first gate metal layer is formed according to the present disclosure.

Then, a second insulating thin film and a first metal thin film are sequentially deposited. The first metal thin film is patterned by a patterning process to form a second insulating layer covering the pattern of the semiconductor layer and a pattern of a first gate metal layer provided on the second insulating layer. The pattern of the first gate metal layer at least includes a gate electrode and a first capacitor electrode in each sub-pixel. After this patterning process, as shown in FIG. 11, the bonding pin region 206 includes a first insulating layer 91, a second insulating layer 92 and first test signal lines 81a stacked on the base substrate 10.

Figure 12:
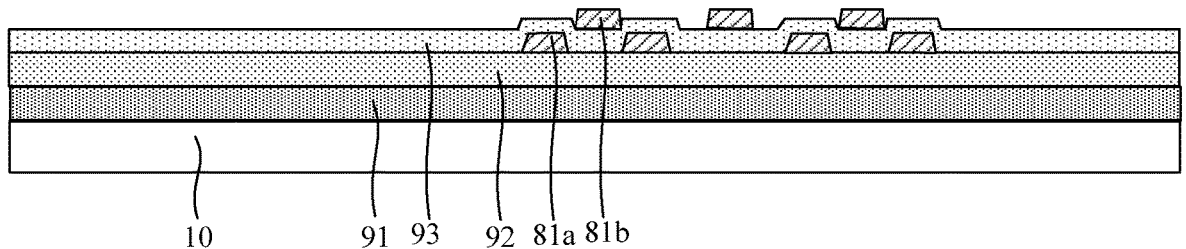
FIG. 12 is a schematic diagram of an exemplary structure of a bonding pin region of a display panel after a second gate metal layer is formed according to the present disclosure.

Then, a third insulating thin film and a second metal thin film are sequentially deposited. The second metal thin film is patterned by a patterning process to form a third insulating layer covering the pattern of the first gate metal layer and a pattern of a second gate metal layer provided on the third insulating layer. The pattern of the second gate metal layer at least includes a second capacitor electrode in each sub-pixel and a second test signal line located in the bonding pin region. In an exemplary embodiment, as shown in FIG. 12, orthographic projections of the first test signal lines 81a and the second test signal lines 81b on the base substrate 10 do not overlap in the bonding pin region 206. In an exemplary embodiment, the first test signal lines 81a and the second test signal lines 81b are alternately provided in the first direction. In an exemplary embodiment of the present disclosure, by respectively arranging adjacent first test signal line 81a and second test signal line 81b in two film layers, and arranging the first test signal line 81a and the second test signal line 81b alternately in the first direction, the intervals between the adjacent first test signal lines 81a and second test signal lines 81b are effectively reduced, thereby effectively improving the connection reliability. At the same time, the compression of the intervals between the first test signal lines and the second test signal lines effectively reduces the width of the whole bonding region, so that the appearance of the product is more aesthetically pleasing.

Figure 13:
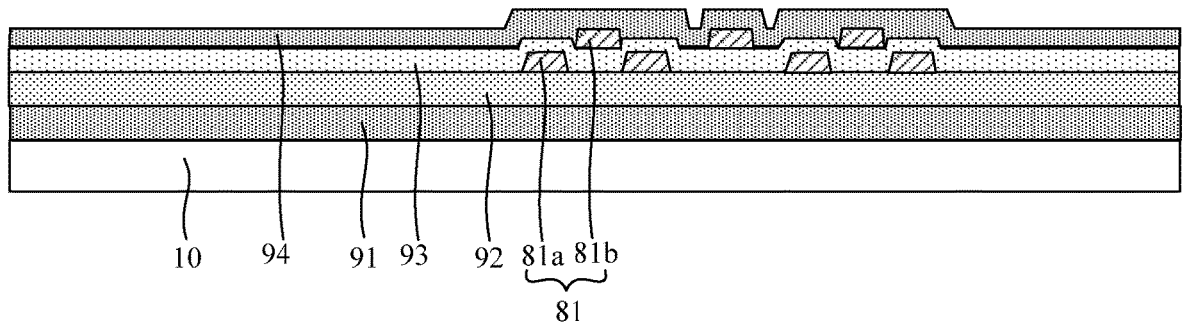
FIG. 13 is a schematic diagram of an exemplary structure of a bonding pin region of a display panel after a fourth insulating layer is formed according to the present disclosure.

Then, a fourth insulating thin film is deposited. The fourth insulating thin film is patterned by a patterning process to form a fourth insulating layer covering the pattern of the second gate metal layer. First vias are formed in the fourth insulating layer. After this patterning process, as shown in FIG. 13, the bonding pin region 206 includes a first insulating layer 91, a second insulating layer 92, first test signal lines 81a, a third insulating layer 93, second test signal lines 81b, and a fourth insulating layer 94 stacked on the base substrate 10.

Figure 14:
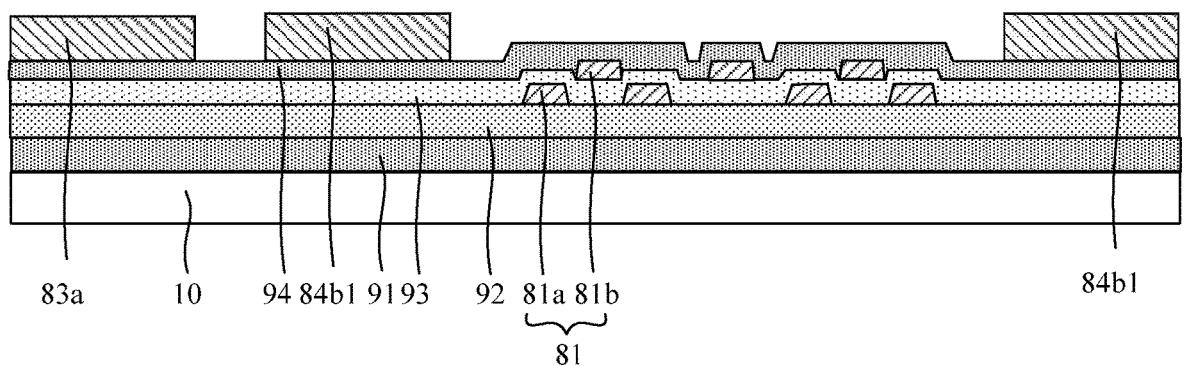
FIG. 14 is a schematic diagram of an exemplary structure of a bonding pin region of a display panel after a first source-drain metal layer is formed according to the present disclosure.

Subsequently, a third metal thin film is deposited. The third metal thin film is patterned by a patterning process to form a pattern of the first source-drain metal layer on the fourth insulating layer. The pattern of the first source-drain metal layer includes at least a source electrode and a drain electrode located in each sub-pixel, and a first sub-bonding pin and first sub-virtual pins located in the bonding pin region. The source electrode and the drain electrode are respectively connected to an active layer through a first via. As shown in FIG. 14, there is no overlapping region between orthographic projections of the first sub-bonding pin 83a, the first sub-virtual pins 84b1, the first test signal lines 81a and the second test signal lines 81b on the base substrate 10.

Figure 15:
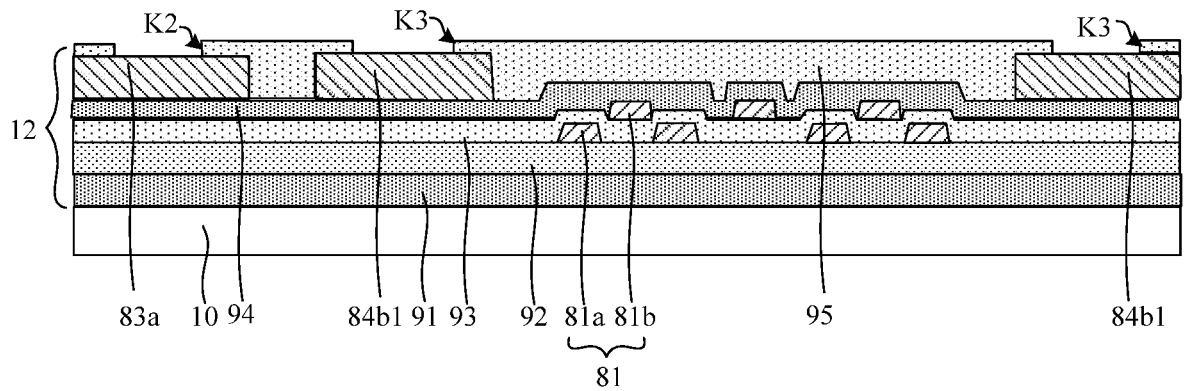
FIG. 15 is a schematic diagram of an exemplary structure of a bonding pin region of a display panel after a planarization layer is formed according to the present disclosure.

Subsequently, a planarization thin film is deposited. The planarization thin film is patterned by a patterning process to form a planarization layer covering the pattern of the first source-drain metal layer. The planarization layer is provided with an anode via, a second via K2, and a third via K3, the anode via is formed in the effective region, and exposes a surface of the drain electrode. As shown in FIG. 15, the second via K2 and the third via K3 are provided in the bonding region 206, the second via K2 exposes a surface of the first sub-bonding pin 83a, and the third via K3 exposes a surface of the first sub-virtual pin 84b1.

Hereto, the manufacture of the pattern of the driving circuit layer is completed.

(3) A pattern of a light-emitting structure layer is formed on the driving circuit layer. In an exemplary embodiment, the formation of the pattern of the light-emitting structure layer may include the following operations.

A conductive thin film is deposited on the base substrate 10 with the above-mentioned patterns formed. The conductive thin film is patterned by a patterning process to form a pattern of an anode. The anode is connected to the drain electrode through the anode via.

Then, the base substrate 10 with the above-mentioned patterns formed is coated with a pixel definition thin film. The pixel definition thin film is patterned by a patterning process to form a pattern of a pixel definition layer. A pixel opening is formed on the pixel definition layer. The pixel opening exposes a surface of the anode.

Then, a pattern of an organic light-emitting layer is formed on the base substrate 10 with the above-mentioned patterns formed by evaporation or ink-jet printing. The organic light-emitting layer is connected to the anode through the pixel opening.

Then, a pattern of a cathode is formed on the base substrate 10 with the above-mentioned patterns formed by evaporation. The cathode is connected to the organic light-emitting layer.

Hereto, the manufacture of the pattern of the light-emitting structure layer is completed. After this patterning process, the film-layer structure of the bonding region 206 has not changed.

(4) A pattern of an encapsulation layer is formed on the light-emitting structure layer. In an exemplary embodiment, the formation of the pattern of the encapsulation layer may include the following operations.

A first encapsulation thin film is deposited at first on the base substrate 10 with the above-mentioned patterns formed to form a first encapsulation layer. Then, an organic encapsulation thin film is formed by an inkjet printing process, and an organic encapsulation layer is formed after curing into a film. Then, a third encapsulation thin film is deposited to form a third encapsulation layer, and a laminated structure of inorganic material/organic material/inorganic material is formed. The organic material layer is provided between two inorganic material layers to ensure that the outside water vapor cannot enter the light-emitting structure layer.

Hereto, the manufacture of the pattern of the encapsulation layer is completed. After this patterning process, the film-layer structure of the bonding region 206 has not changed.

(5) A pattern of a touch electrode layer is formed on the encapsulation layer. In an exemplary embodiment, the formation of the pattern of the touch electrode layer may include the following operations.

Figure 16:
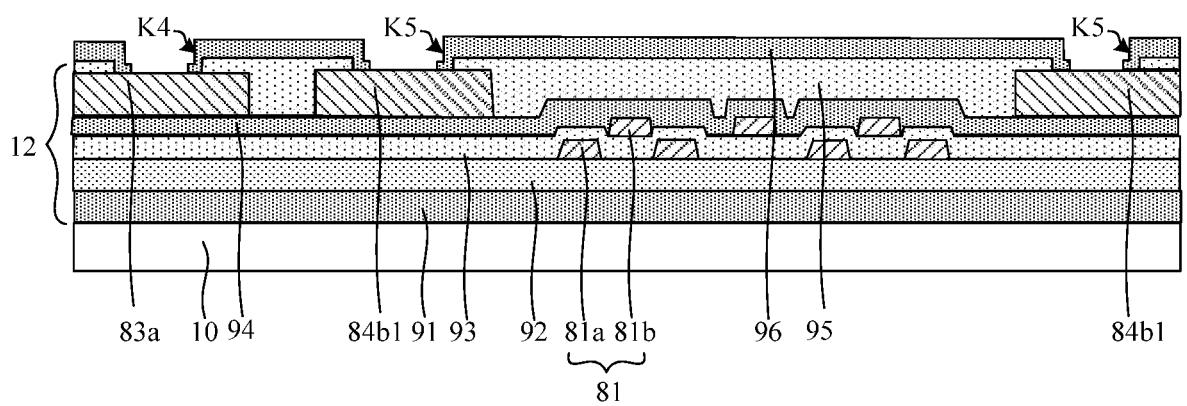
FIG. 16 is a schematic diagram of an exemplary structure of a bonding pin region of a display panel after a touch insulating layer is formed according to the present disclosure.

A touch insulating thin film is deposited. The touch insulating thin film is patterned by a patterning process to form a touch insulating (TLD) layer. The touch insulating layer is formed with a touch via, a fourth via K4 and a fifth via K5. The touch via is formed in the effective region. As shown in FIG. 16, the fourth via K4 and the fifth via K5 are formed in the bonding pin region 206, the fourth via K4 is in communication with the second via K2, the fifth via K5 is in communication with the third via K3, wherein the fourth via K4 and the second via K2 expose a surface of the first sub-bonding pin 83a, and the fifth via K5 and the third via K3 expose a surface of the first sub-virtual pin 84b1. In an exemplary embodiment, the touch insulating layer may be made of any one or more of silicon oxide (SiOx), silicon nitride (SiNx), and silicon oxynitride (SiON), and may be in a single layer, multiple layers, or a composite layer.

Then, a touch metal thin film is deposited. The touch metal thin film is patterned by a patterning process to form a pattern of a touch electrode layer on the touch insulating layer. The pattern of the touch electrode layer at least includes a touch electrode and a touch trace which are located in the effective region, a signal lead located in a frame region, and a second sub-bonding pin 83b, a second sub-virtual pin 84b2 and a first virtual pin 84a which are located in the bonding pin region 206. The touch electrode and the touch trace are in the form of metal mesh, and the signal lead is connected to a signal electrode in the display unit through the touch via. The second sub-bonding pin 83b is connected to the first sub-bonding pin 83a through the fourth via K4 and the second via K2, and the second sub-bonding pin 83b and the first sub-bonding pin 83a form a bonding pin 83. The second sub-virtual pin 84b2 is connected to the first sub-virtual pin 84b1 through the fifth via K5 and the third via K3, and the second sub-virtual pin 84b2 and the first sub-virtual pin 84b1 form a second virtual pin 84b, as shown in FIG. 8. In an exemplary embodiment, the touch metal thin film may be in a single-layer structure of, for example, any one or more of Argentum (Ag), Copper (Cu), Aluminum (Al), Titanium (Ti), and Molybdenum (Mo), or a laminated structure of, for example, Ti/Al/Ti.

Then, a protective thin film is coated to form a touch protective layer covering the pattern of the touch electrode layer. In an exemplary embodiment, the touch protective layer may be made of Polyimide (PI), etc. After this patterning process, the film-layer structure of the bonding region 206 has not changed.

Hereto, the manufacture of the pattern of the touch electrode layer is completed.

As shown in FIGS. 7 and 8, in an embodiment of the present disclosure, the bonding pin, the first virtual pin and the second virtual pin have similar film layer stacking structure, which reduces the relative segment difference and avoids the peeling problem that easily occurs to the film layers in the process engineering.

In an embodiment of the present disclosure, the test signal lines are routed using the first gate metal layer and the second gate metal layer instead of the first source-drain metal layer, which may reduce the height of the first virtual pin, so that in the bonding process, a test signal line at the bottom of the first virtual pin will not become a direct pressure point and will be prevented from being pressed to be broken.

In an embodiment of the present disclosure, second virtual pins are further provided on two sides of the first virtual pin, the function of the second virtual pins is to play a supporting role in the bonding process, and the second virtual pins become direct pressure points in the bonding process, which further ensures that a test signal line at the bottom of the first virtual pin will not be pressed to be broken.

The structure of the display panel of the exemplary embodiment of the present disclosure and the manufacturing process thereof are described only as an example. In an exemplary embodiment, changes in corresponding structures and addition or deletion of patterning processes may be made as practically required. No limits are made in the present disclosure.

Figure 17:
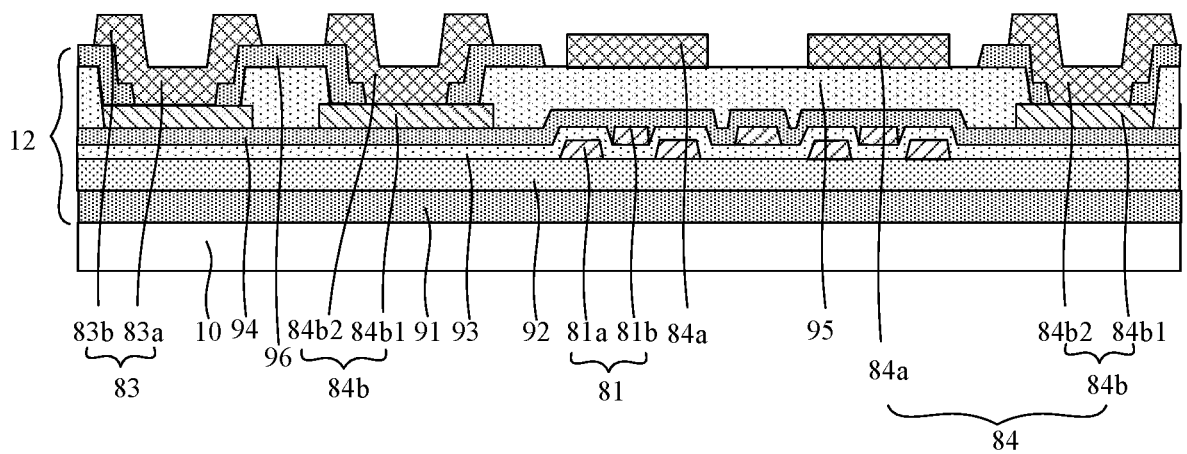
FIG. 17 is a schematic diagram of an exemplary structure of a bonding pin region of a display panel after a touch electrode layer is formed according to the present disclosure.

In an exemplary embodiment, as shown in FIG. 17, a height of a side of the second virtual pin 84b away from the base substrate 10 with respect to the base substrate 10 is greater than a height of a side of the first virtual pin 84a away from the base substrate 10 with respect to the base substrate 10.

The present disclosure further provides a method for manufacturing a display substrate, wherein the display panel includes an effective region and a bonding region located on one side of the effective region, the bonding region includes a bonding pin region, the manufacturing method includes:

forming test signal lines, a bonding pin and virtual pins in the bonding pin region, wherein an orthographic projection of at least one of the test signal lines on the base substrate is within a range of an orthographic projection of the virtual pin on the base substrate, and the orthographic projection of the virtual pin on the base substrate and an orthographic projection of the bonding pin on the base substrate do not overlap.

In an exemplary embodiment, the virtual pins include a first virtual pin and a second virtual pin, an orthographic projection of the first virtual pin on the base substrate and an orthographic projection of the second virtual pin on the base substrate do not overlap, an orthographic projection of at least one of the test signal lines on the base substrate is within a range of the orthographic projection of the first virtual pin on the base substrate, and an orthographic projection of the test signal lines on the base substrate and the orthographic projection of the second virtual pin on the base substrate do not overlap.

In an exemplary embodiment, in a plane perpendicular to the display panel, the display panel includes a first conductive layer provided on the base substrate, a second conductive layer provided on the first conductive layer, a third conductive layer provided on the second conductive layer, and a fourth conductive layer provided on the third conductive layer.

The test signal lines are provided in a same layer as at least one of the first conductive layer and the second conductive layer.

The first virtual pin is provided in a same layer as the fourth conductive layer.

The bonding pin and the second virtual pin are provided in s same layer as the third conductive layer and the fourth conductive layer, respectively.

The present disclosure further provides a display device including any one of the aforementioned display panels. The display device may be any product or component with a display function, such as a mobile phone, a tablet computer, a television, a display, a notebook computer, a digital photo frame, or a navigator.

The drawings of the present disclosure only involve the structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present application.

The invention claimed is:

1. A display panel, comprising a base substrate, an effective region provided on the base substrate and a bonding region located on a side of the effective region;
   wherein the bonding region comprises a bonding pin region comprising bonding pins, virtual pins and test signal lines;
   an orthographic projection of at least one of the test signal lines on the base substrate is within a range of an orthographic projection of at least one of the virtual pins on the base substrate, and the orthographic projection of the at least one of the virtual pins on the base substrate does not overlap with orthographic projections of the bonding pins on the base substrate;
   the effective region comprises the base substrate and a display unit and a touch unit which are stacked on the base substrate, the display unit comprises a plurality of data lines and a plurality of gate lines, the plurality of data lines and the plurality of gate lines intersect with each other to define a plurality of sub-pixels, and the touch unit comprises a plurality of touch electrodes and touch leads connected to the plurality of touch electrodes; and
   the display panel further comprises an array test region located on a side of the bonding region away from the effective region, the array test region comprises test pins, and the test signal lines are connected to the test pins and are configured to test one or more of the display unit and the touch unit.

2. The display panel according to claim 1, wherein the virtual pins comprise a first virtual pin and a second virtual pin, an orthographic projection of the first virtual pin on the base substrate does not overlap with an orthographic projection of the second virtual pin on the base substrate, the orthographic projection of the at least one of the test signal lines on the base substrate is within a range of the orthographic projection of the first virtual pin on the base substrate, and the orthographic projection of the at least one of the test signal lines on the base substrate does not overlap with the orthographic projection of the second virtual pin on the base substrate.

3. The display panel according to claim 2, wherein a width of the orthographic projection of the first virtual pin on the base substrate in a first direction is equal to a width of an orthographic projection of M test signal lines on the base substrate in the first direction, a distance between two adjacent pins is greater than a width of N test signal lines in the first direction, M is a natural number greater than or equal to 1, and N is a natural number greater than or equal to 1.

4. The display panel according to claim 3, wherein M is 3, and N is 1.

5. The display panel according to claim 2, wherein x first virtual pins are provided between two second virtual pins, and x is a natural number between 1 and 3.

6. The display panel according to claim 2, wherein a height of the second virtual pin at a side away from the base substrate with respect to the base substrate is greater than a height of the first virtual pin at a side away from the base substrate with respect to the base substrate.

7. The display panel according to claim 2, wherein in a plane perpendicular to the display panel, the display panel comprises a first conductive layer provided on the base substrate, a second conductive layer provided on the first conductive layer, a third conductive layer provided on the second conductive layer, and a fourth conductive layer provided on the third conductive layer;
   the test signal lines are provided in a same layer as at least one of the first conductive layer and the second conductive layer;
   the first virtual pin is provided in a same layer as the fourth conductive layer; and
   the bonding pins are provided in a same layer as the third conductive layer and the second virtual pin is provided in a same layer as the fourth conductive layer.

8. The display panel according to claim 7, wherein in a plane perpendicular to the display panel, the display panel comprises a driving circuit layer, a light-emitting structure layer, an encapsulation layer and a touch structure layer which are sequentially stacked on the base substrate; the driving circuit layer comprises a first insulating layer, an active layer, a second insulating layer, a first gate metal layer, a third insulating layer, a second gate metal layer, a fourth insulating layer and a first source-drain metal layer which are stacked on the base substrate, and the touch structure layer comprises a touch insulating layer, a touch electrode layer and a touch protective layer which are stacked on the encapsulation layer; and the first conductive layer is provided in a same layer as the first gate metal layer, the second conductive layer is provided in a same layer as the second gate metal layer, the third conductive layer is provided in a same layer as the first source-drain metal layer, and the fourth conductive layer is provided in a same layer as the touch electrode layer.

9. The display panel according to claim 7, wherein the test signal lines comprise: first test signal lines on the first conductive layer and second test signal lines on the second conductive layer;

an orthographic projection of the first test signal lines on the base substrate does not overlap with an orthographic projection of the second test signal lines on the base substrate, the first test signal lines and the second test signal lines both extend in a second direction, and the first test signal lines and the second test signal lines are alternately provided in a first direction, wherein the first direction intersects with the second direction.

10. The display panel according to claim 9, wherein a width of a first test signal line in the first direction is equal to a width of a second test signal line in the first direction, and a distance between adjacent first test signal lines is equal to a distance between adjacent second test signal lines.

11. The display panel according to claim 10, wherein the width of the first test signal line in the first direction is between 7 microns and 17 microns, and the distance between adjacent first and second test signal lines is between 8 microns and 18 microns.

12. The display panel according to claim 1, wherein a width of at least one of the bonding pins in a first direction is equal to a width of the at least one of the virtual pins in the first direction, and a distance between each two adjacent pins is equal.

13. The display panel according to claim 12, wherein the width of the at least one of the bonding pins in the first direction is between 45 microns and 75 microns, and the distance between two adjacent pins is between 25 microns and 55 microns.

14. The display panel according to claim 12, wherein a length of the at least one of the bonding pins in a second direction is equal to a length of the at least one of the virtual pins in the second direction, and the length of the at least one of the bonding pins in the second direction is between 900 microns and 1000 microns.

15. The display panel according to claim 1, further comprising a first power supply line and a second power supply line, wherein 2n test signal lines are comprised, the bonding pins comprise a plurality of first bonding pins connected to the first power supply line and a plurality of second bonding pins connected to the second power supply line, the 2n test signal lines are provided between the plurality of second bonding pins, the plurality of second bonding pins are provided between the plurality of first bonding pins, the 2n test signal lines are symmetrically provided along a center line of the bonding region, the plurality of first bonding pins are symmetrically provided along the center line of the bonding region, and the plurality of second bonding pins are symmetrically provided along the center line of the bonding region, wherein n is a natural number.

16. The display panel according to claim 15, wherein n test signal lines are divided into at least two test signal line groups on a side of the center line of the bonding region, and the at least one of the virtual pins is provided between two adjacent test signal line groups.

17. The display panel according to claim 16, wherein an orthographic projection of one of the at least two test signal line groups on the base substrate has a width in a first direction between 150 microns and 300 microns.

18. A display device, comprising the display panel according to claim 1.

19. A method for manufacturing a display panel, wherein the display panel comprises a base substrate, an effective region provided on the base substrate and a bonding region located on one side of the effective region, the bonding region comprises a bonding pin region, and the method comprises:

forming test signal lines, a bonding pin and a virtual pin in the bonding pin region, wherein an orthographic projection of at least one of the test signal lines on the base substrate is within a range of an orthographic projection of the virtual pin on the base substrate, and the orthographic projection of the virtual pin on the base substrate does not overlap with an orthographic projection of the bonding pin on the base substrate;

wherein the effective region comprises the base substrate and a display unit and a touch unit which are stacked on the base substrate, the display unit comprises a plurality of data lines and a plurality of gate lines, the plurality of data lines and the plurality of gate lines intersect with each other to define a plurality of sub-pixels, and the touch unit comprises a plurality of touch electrodes and touch leads connected to the plurality of touch electrodes; and the display panel further comprises an array test region located on a side of the bonding region away from the effective region, the array test region comprises test pins, and the test signal lines are connected to the test pins and are configured to test one or more of the display unit and the touch unit.

* * * * *